(12) United States Patent
Cheng et al.

(10) Patent No.: US 10,788,764 B2
(45) Date of Patent: Sep. 29, 2020

(54) APPARATUS AND A METHOD OF FORMING A PARTICLE SHIELD

(71) Applicant: Taiwan Semiconductor Manufacturing Company, Ltd., Hsin-Chu (TW)

(72) Inventors: Wen-Hao Cheng, Hsinchu (TW); Chue San Yoo, Hsinchu (TW); Ching-Yueh Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/186,249

(22) Filed: Nov. 9, 2018

(65) Prior Publication Data
US 2019/0094719 A1   Mar. 28, 2019

Related U.S. Application Data

(63) Continuation-in-part of application No. 15/718,396, filed on Sep. 28, 2017, now Pat. No. 10,126,666, which is a continuation of application No. 15/399,180, filed on Jan. 5, 2017, now Pat. No. 10,168,626.

(60) Provisional application No. 62/351,764, filed on Jun. 17, 2016.

(51) Int. Cl.
*G03B 27/52* (2006.01)
*G03F 7/20* (2006.01)
*H01L 21/67* (2006.01)

(52) U.S. Cl.
CPC .......... *G03F 7/70916* (2013.01); *G03F 7/707* (2013.01); *G03F 7/70875* (2013.01); *G03F 7/70933* (2013.01); *H01L 21/67017* (2013.01); *H01L 21/67115* (2013.01); *H01L 21/67253* (2013.01)

(58) Field of Classification Search
CPC .. G03F 7/707; G03F 7/70875; G03F 7/70916; G03F 7/70933; H01L 21/67017; H01L 21/67115; H01L 21/67253; B05B 11/061
See application file for complete search history.

(56) References Cited

U.S. PATENT DOCUMENTS

| 6,305,097 B1 | 10/2001 | Salamati-Saradh et al. |
| 6,555,834 B1 | 4/2003 | Loopstra |
| 6,921,613 B2 | 7/2005 | Enloe |

(Continued)

FOREIGN PATENT DOCUMENTS

| CN | 102193337 A | 9/2011 |
| EP | 1098226 | 5/2001 |

(Continued)

*Primary Examiner* — Peter B Kim
(74) *Attorney, Agent, or Firm* — Haynes and Boone, LLP

(57) ABSTRACT

An apparatus for generating a laminar flow includes an injection nozzle and a suction nozzle. The injection nozzle and the suction nozzle are operable to form the laminar flow for blocking particles from contacting a proximate surface of an object. The injection nozzle includes a main outlet to blow out the laminar flow. The injection nozzle is configured to generate a Coanda flow along an external surface of the injection nozzle. The suction nozzle is configured to provide a gas pressure gradient for the laminar flow.

20 Claims, 14 Drawing Sheets

(56) References Cited

U.S. PATENT DOCUMENTS

| | | |
|---|---|---|
| 7,138,640 B1 | 11/2006 | Delgado et al. |
| 9,513,566 B2 | 12/2016 | Bal et al. |
| 9,632,437 B2 | 4/2017 | Park et al. |
| 2003/0006380 A1 | 1/2003 | Van Empel et al. |
| 2005/0199829 A1 | 9/2005 | Partio et al. |
| 2005/0275835 A1 | 12/2005 | Sogard |
| 2006/0119811 A1 | 6/2006 | Simon |
| 2007/0285632 A1 | 12/2007 | Phillips et al. |
| 2007/0298362 A1 | 12/2007 | Rocha-Alvarez et al. |
| 2009/0207394 A1 | 8/2009 | Shibazaki |
| 2011/0228239 A1 | 9/2011 | Gosen et al. |
| 2012/0144809 A1* | 6/2012 | Ducroquet ............ F01N 3/2066 60/295 |
| 2014/0111782 A1 | 4/2014 | Park et al. |
| 2014/0322897 A1 | 10/2014 | Samir et al. |

FOREIGN PATENT DOCUMENTS

| | | |
|---|---|---|
| EP | 1326139 | 7/2003 |
| JP | 2004214552 | 7/2004 |
| KR | 20010051439 A | 6/2001 |
| KR | 20110105731 A | 9/2011 |
| TW | 201202862 | 1/2012 |
| WO | WO2008046035 | 4/2008 |
| WO | WO2009078422 | 6/2009 |

\* cited by examiner

APPARATUS AND A METHOD OF FORMING A PARTICLE SHIELD

PRIORITY CLAIM

This is a continuation-in-part application of U.S. patent application Ser. No. 15/718,396, filed Sep. 28, 2017, which is a continuation application of U.S. patent application Ser. No. 15/399,180, filed Jan. 5, 2017, which claims benefits of U.S. Prov. App. Ser. No. 62/351,764, filed Jun. 17, 2016, the entire content of which is incorporated by reference herein.

BACKGROUND

Semiconductor manufacturing includes various processes such as photolithography, etching, and diffusion. Functional density has increased by decreasing a geometric size of components for integrated chips. Such scaling down process enhances production efficiency and lowers associated manufacturing costs. Removing debris and by-products from equipment, photomasks and wafers helps to improve production yield.

In some approaches, a cleaning solvent such as deionized water is sprayed on a surface to remove particles accumulated on the surface. In some approaches, a solid shield is installed on a wafer transportation/storage pad during the manufacturing processes. In some approaches, loading and unloading of wafers are performed automatically by a sealed input/output tool such as a standard mechanical interface (SMIF) apparatus. In some approaches, clothing of a process operator is cleaned to reduce contamination from particles introduced into a manufacturing environment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
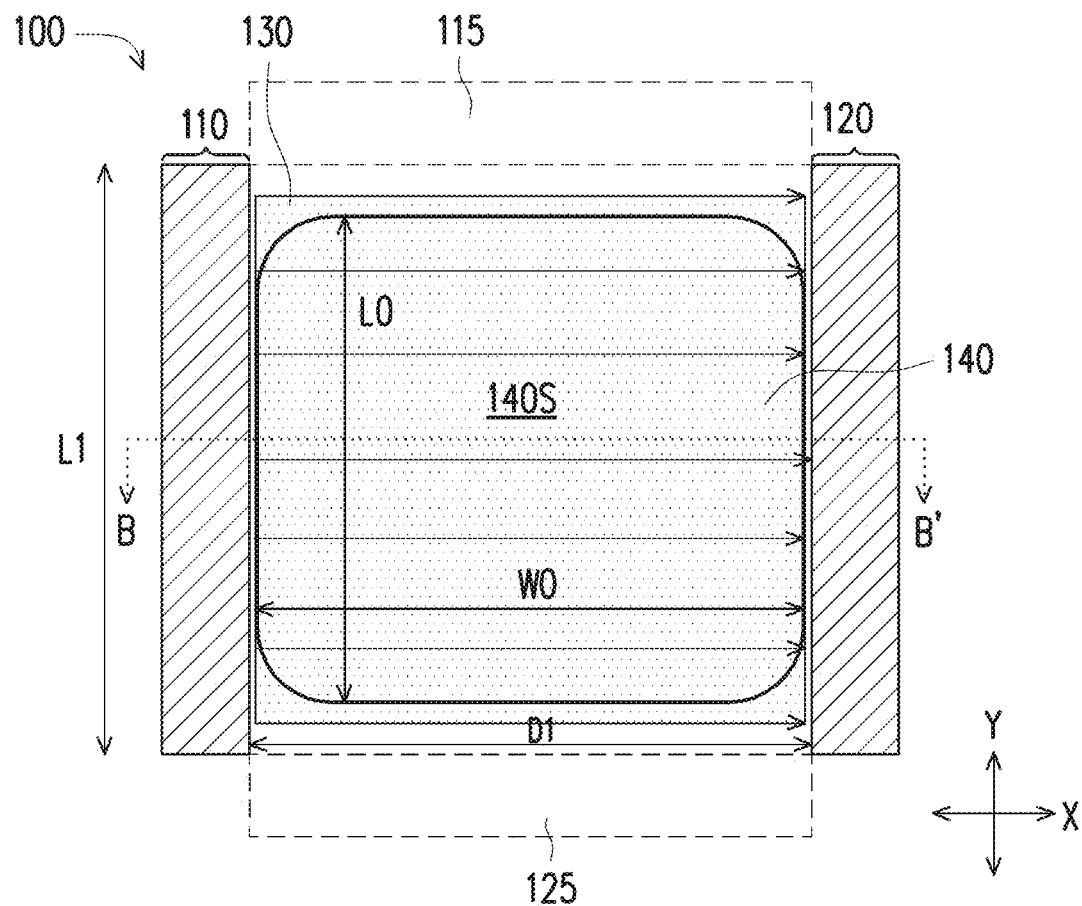
FIG. 1A is a top view of an apparatus for generating a particle shield in accordance with one or more embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Photolithography is a process by which a pattern on a photomask is transferred to a substrate or a layer on the substrate. The photomask, a frame and a pellicle are collectively referred to as a mask system. The frame holds the photomask and the pellicle comprises a transparent thin film over the frame. The pellicle protects the photomask and helps to prevent particles from entering a focal point of light passing through the photomask. Particles are introduced into the photolithography apparatus due to the removal of the photomask from a chuck, or material removal from the substrate or the layer on the substrate, or by other contaminants present in the manufacturing environment. Particles in an optical path of light passing through the photomask disperse light which is incident on the particles. This light dispersion degrades the quality of the pattern imparted by the light beam through the photomask. The particles also adhere on surfaces of the substrate (or the layer on the substrate), manufacturing equipment or measuring system. Particles on the substrate or on the layer of the substrate potentially block light from the photomask from being incident on the substrate (or the layer on the substrate) and prevent precise transfer of the pattern of the photomask. Particles on a surface of manufacturing equipment or measuring system also potentially disperse light contacting those elements and reduce precision of the pattern transfer. In at least one embodiment, a shielding apparatus helps prevent particles from adhering to the surfaces or removes the particles from the surfaces or the optical path during the manufacturing processes and, in turn, improves manufacturing yield.

FIG. 1A is a top view of an apparatus 100 for generating a particle shield 130, also referred to as a particle shield generator, in accordance with one or more embodiments. Apparatus 100 includes a first component 110 and a second component 120. Apparatus 100 is configured to generate particle shield 130 between first component 110 and second component 120. In order to help prevent particles or contaminants from falling onto or contacting a surface 140S of an object 140, particle shield 130 (symbolized by arrows) overlaps and is physically separated from surface 140S in some embodiments. In some embodiments, particle shield 130 is invisible to the human eye. In some embodiments, object 140 is a substrate, a photomask, a wafer, or an inner wall of a carrier (e.g., a wafer carrier or a photomask carrier). In some embodiments, the substrate or the wafer includes one or more layers. In some embodiments, the combination of a substrate (e.g., a silicon wafer or a glass substrate) and an additional layer over the substrate is still referred to as the substrate during a manufacturing process. In some embodiments, object 140 is a selected component in a manufacturing system, such as a reticle edge masking assembly (REMA), an illumination aperture or a lens in a scanner system. In some embodiments, surface 140S has a rectangular shape defined by a length L0 and a width W0, corresponding to a length L1 and a distance D1 of particle shield 130. In order to substantially cover surface 140S, length L1 is equal to or longer than length L0, and distance D1 is equal to or longer than width W0. As a result, an area of particle shield 130 is equal to or greater than an area of surface 140S. In some embodiments, length L1 and distance D1 range between from about 127 millimeters (mm) to about 305 mm. Longer length L1 or longer Distance D1 as well as shorter length L1 or shorter distance D1 increase the difficulty of controlling particle shield 130, in some instances.

In some embodiments, both first component 110 and second component 120 are fixed relative to surface 140S. In some embodiments, at least one of first component 110 or second component 120 is movable relative to surface 140S. In at least one embodiment, a movement is along a direction X, which is parallel to distance D1. In at least one embodiment, a movement is along a direction Y, which is parallel to length L1. Direction X and direction Y are parallel to surface 140S. A longitudinal axis (e.g., along Y direction) of first component 110 is parallel to a longitudinal axis (e.g., along Y direction) of second component 120. In some embodiments, the longitudinal axis of first component 110 and the longitudinal axis of second component 120 are parallel to surface 140S. In some embodiments, at least one of first component 110 or second component 120 is movable along a direction Z orthogonal to surface 140S.

In some embodiments, first component 110 and second component 120 are physically coupled to each other, either directly or through other hardware (not shown). In some embodiments, first component 110 and second component 120 are physically separated from each other. Apparatus 100 includes first component 110 and second component 120 on opposite sides of object 140; however, in some embodiments, first component 110 and second component 120 have a different arrangement with respect to object 140 in order to protect other surfaces. In some embodiments, apparatus 100 also includes a third component 115 and a fourth component 125. In some embodiments, third component 115 and fourth component 125 are positioned transverse to first component 110 and second component 120. In some embodiments, apparatus 100 is operable to form an additional particle shield between third component 115 and fourth component 125. In some embodiments, third component 115 and fourth component 125 provide a redundant apparatus in case first component 110 or second component 120 fails, in such a way, the additional particle shield is positioned to be substantially co-planar with particle shield 130. In some embodiments, third component 115 and fourth component 125 provide an additional particle shield to enhance the protection, in such a way; the additional particle shield is above or below particle shield 130. In some embodiments, first component 110 and second component 120 are usable to form particle shield 130 simultaneously with third component 115 and fourth component 125 forming the additional particle shield. In some embodiments, first component 110 and second component 120 are usable to form particle shield 130 before or after third component 115 and fourth component 125 forms the additional particle shield.

Figure 1B:
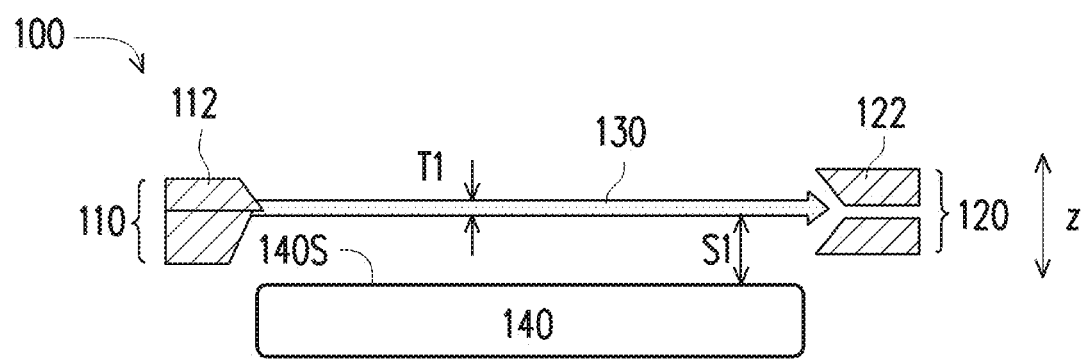
FIGS. 1B and 1B' are cross-sectional views of the apparatus for generating the particle shield taken along line B-B' in FIG. 1A in accordance with one or more embodiments.
Figure 1B:
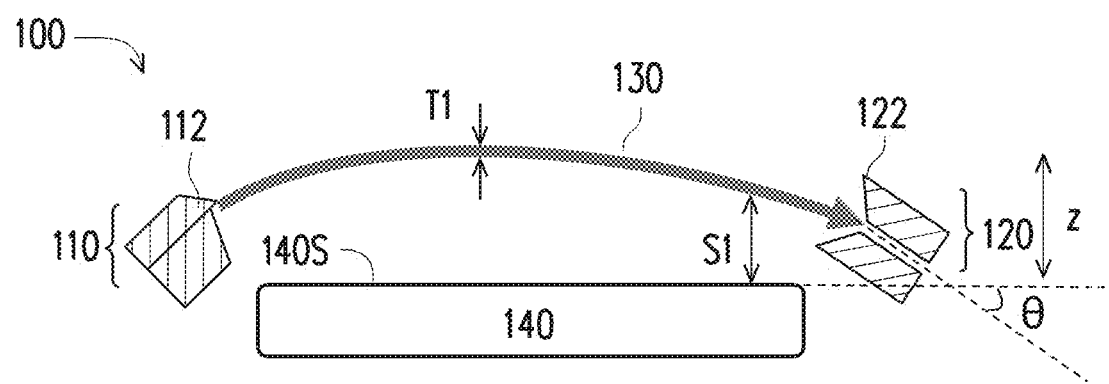

In some embodiments, at least one of the axis of first component 110 or the axis of second component 120 is tilted relative to surface 140S (as shown in FIG. 1B'). An angle of the tilting θ ranges from greater than 0 degrees to about 45 degrees, which is adjustable based on the area of surface 140S and a working environment.

FIG. 1B is a cross-sectional view of apparatus 100 for generating particle shield 130 taken along line B-B' in FIG. 1A in accordance with one or more embodiments. In some embodiments, first component 110 includes at least a gas injector 112. In at least one embodiment, gas injector 112 is called an air knife or an air jet. In some embodiments, particle shield 130 is blown out of gas injector 112 into a space by the Coanda effect, which describes an adherence of fluid when close to a surface, resulting in an asymmetric expansion. In some embodiments, particle shield 130 is formed by compressing or pumping a gas from gas injector 112. In some embodiments, a gas supply is connected to gas injector 112 by a connecting pipe (not shown). In some embodiments, particle shield is generated by a pressure difference between first component 110 and second component 120. Gas injector 112 injects and provides fluid dynamic control of particle shield 130, a protective gas stream flowed into a space between first component 110 and second component 120. In some embodiments, particle shield 130 is a gas curtain including an inert gas such as argon or helium. In some embodiments, particle shield 130 includes ambient air, nitrogen, hydrogen, or combinations thereof.

In some embodiments, second component 120 includes at least a gas extractor 122. In at least one instance, gas extractor 122 and gas injector 112 are aligned at the same level in a direction Z, which is parallel to the normal line of surface 140S. In some embodiments, gas extractor 122 is above or below gas injector 112 in direction Z. In at least one embodiment, gas extractor 122 draws particles output by gas injector 112 as well as other particles which pass between gas injector 112 and gas extractor 122. In some embodiments, gas extractor 122 includes a vacuum. Gas injector 112 and gas extractor 122 work together to provide an adequate air pressure gradient, even in a vacuum environment, for particle shield 130 to help prevent particles or contaminants from reaching surface 140S. In some embodiments, during operation, particle shield 130 is circulated through gas injector 112 and gas extractor 122, for example, by circulating the gas from the gas extractor 122 back to gas injector 112 after filtering any particles therein. In some embodiments, instead of gas extractor 122, second component 120 optionally includes an air receiver for passively receiving particle shield 130 formed by gas from gas injector 112.

Particle shield 130 is separated from surface 140S by a spacing S1 ranging from about 0.5 mm to about 30 centimeters (cm) in some embodiments. Larger spacing S1 reduces a functionality of particle shield 130 because increased space between particle shield 130 and surface 140S will permit particles to enter into spacing S1 from direction X or direction Y for a longer distance, in some instances. Shorter spacing S1 increases a risk of a contact between particle shield 130 and surface 140S, in some instances.

Particle shield 130 has a thickness T1 above surface 140S. Thickness T1 ranges from about 1 mm to about 90 mm in some embodiments. Due to a low density of particle shield 130, thicker thickness T1 reduces a functionality of particle shield 130, in some instances. In some embodiments, thickness T1 is substantially uniformly distributed between first component 110 and second component 120. Such particle shield 130 is a type of laminar flow and mechanisms for forming a laminar flow will be further discussed in association with FIGS. 6-8. In some embodiments, thickness T1 increases from first component 110 to second component 120.

In some embodiments, first component 110 includes two or more air injectors 112 positioned side by side, i.e., along direction Y, or one over another, i.e., along direction Z. In some embodiments, when positioned side by side, an outlet of each gas injector 112 is formed in a nozzle shape. In some embodiments, when positioned one over another, an outlet of each gas injector 112 is formed in a slot shape extending in direction Y. In some embodiments, in order to provide additional gas extraction, second component 120 includes two or more gas extractors 122.

Figure 1C:
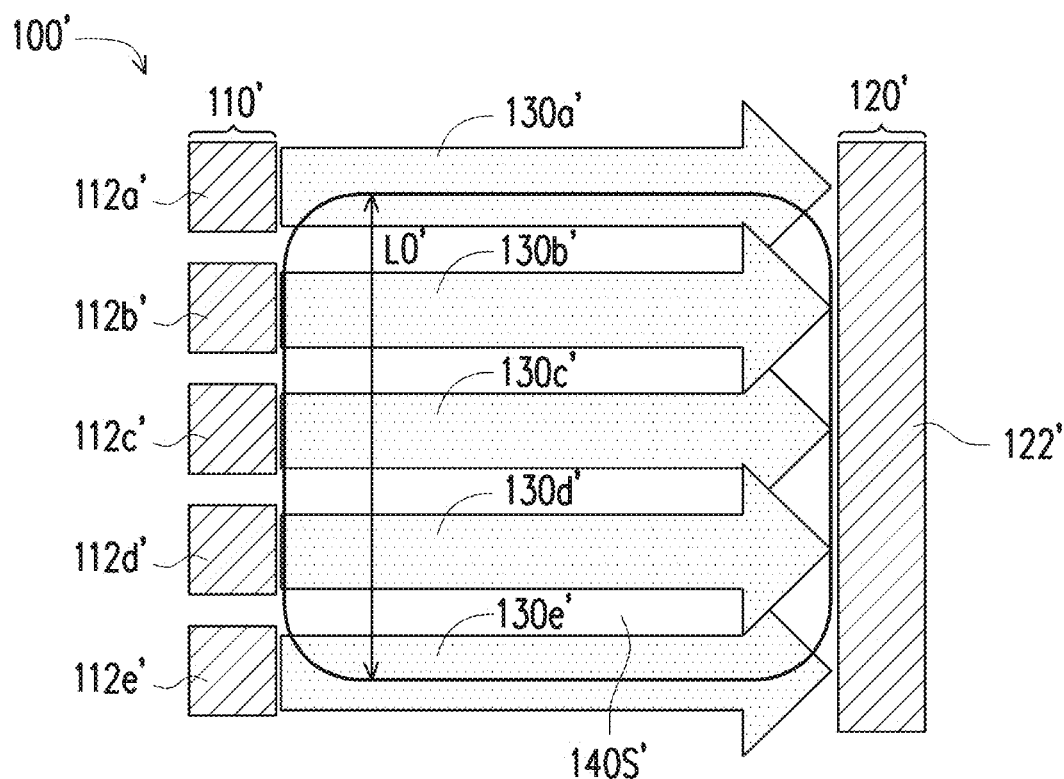
FIG. 1C is a top view of an apparatus for generating a plurality of particle shields in accordance with one or more embodiments.

FIG. 1C is a top view of an apparatus 100' for generating a plurality of particle shields 130a', 130b', 130c', 130d' and 130e' in accordance with one or more embodiments. Apparatus 100' is similar to apparatus 100, like elements have a same reference numeral with a prime symbol. First component 110', corresponding to another embodiment of first component 110, includes plural gas injectors 112a', 112b', 112c', 112d' and 112e', and second component 120', corresponding to another embodiment of second component 120, includes gas extractor 122'. Plural particle shields 130a'-130e' are generated between gas injectors 112a'-112e' and gas extractor 122'. In some embodiments, gas extractor 122' includes a plurality of gas extractors, where each gas extractor corresponds to one of gas injectors 112a'-112e'. Similar to apparatus 100 in FIG. 1B, a combined area of particle shields 130a'-130e' is equal to or greater than surface 140S'. In some embodiments, every particle shield 130a'-130e' includes a same gas. In some embodiments, at least one of particles shields 130a'-130e' includes a different gas from a gas of at least one other of particle shields 130a'-130e'.

Figure 1D:
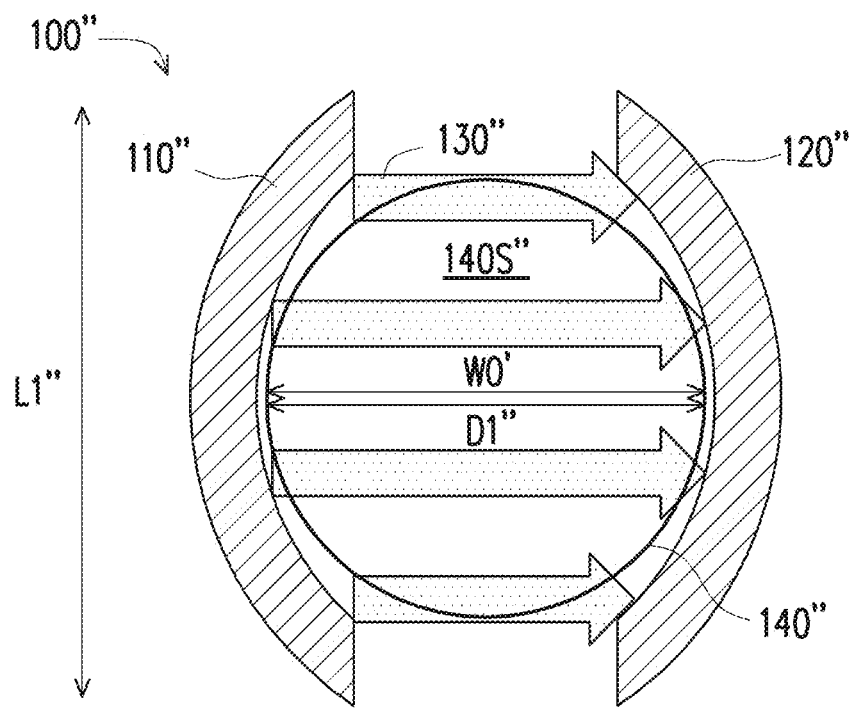
FIG. 1D is a top view of an apparatus for generating a particle shield in accordance with one or more embodiments.

FIG. 1D is a top view of an apparatus 100" for generating a particle shield 130" in accordance with one or more embodiments. Apparatus 100" is similar to apparatus 100, like elements have a same reference numeral with a double prime symbol. Apparatus 100" includes a first component 110" and a second component 120". First component 110" and second component 120" have a curved shape. Particle shield 130" is generated between first component 110" and second component 120". Particle shield 130" helps prevent contaminants from reaching a surface 140S" of object 140". In some embodiments, surface 140S" has a circular shape defined by a diameter W0" and particle shield 130" has an oval shape covering surface 140S" and the oval shape has major and minor axes with different lengths. In one example, the minor axis is along a direction pointing from the first component 110" to the second component 120". A length L1" and a distance D1" are therefore determined based on surface 140S". In order to substantially cover surface 140S", each of length L1" and distance D1" is equal to or longer than diameter W0". For example, for a 300-mm (12 inches) wafer, each of length L1" and distance D1" is equal to or greater than 300 mm (12 inches).

Figure 2A:
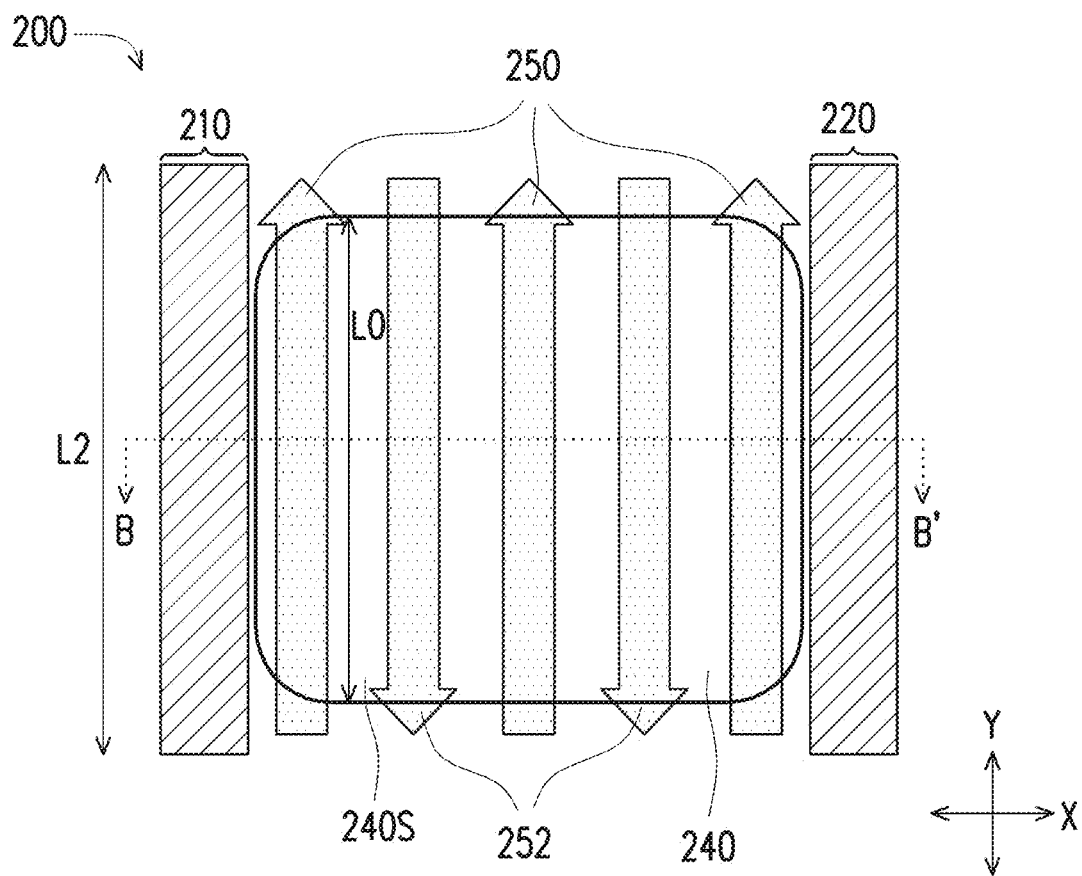
FIG. 2A is a top view of an apparatus for generating a particle shield in accordance with one or more embodiments.

FIG. 2A is a top view of an apparatus 200 for generating a particle shield 230, also referred to as a particle shield generator, in accordance with one or more embodiments. Apparatus 200 is similar to apparatus 100, like elements have a same reference numeral increased by 100. Apparatus 200 includes a first component 210 and a second component 220. Apparatus 200 is configured to generate particle shield 230 (best seen in FIG. 2B) between first component 210 and second component 220. In at least one embodiment, particle shield 230 is a magnetic field. In some embodiments, first component 210 and/or second component 220 have electromagnets or permanent magnets. In some embodiments, parameters in the design of positioning, spacing and strength of particle shield 230 configuration are computationally optimized based on electromagnetics and the dimensions of the surface area to be protected from particle contamination. In some embodiments, length L2 ranges from about 127 mm to about 305 mm. In some embodiments, the magnetic strength ranges from about 0.5 to 1.4 (Tesla) or larger. The smaller magnetic strength reduces a protective function of particle shield 230, in some instances. In some embodiments, particle shield 230 exerts a velocity dependent force such as a Lorentz force caused by an interaction between the magnetic field and at least one moving charged particle.

A first force 250 and a second force 252 are in opposite directions along direction Y. Under the electromagnetic field Lorentz force, when approaching particle shield 230, charged particles or contaminants will be driven away from an area of a surface 240S of an object 240 along direction Y. The Lorentz force is perpendicular to both a velocity of the charged particle and a magnetic field, i.e., particle shield 230, with direction given by the right hand rule. The force is given by the charge times the vector product of velocity and magnetic field. Positive charged particles are forced in a first direction and negative charged particles are forced in a second direction opposite the first direction. For example, when a negative charged particle contacts particle shield 230, the negative charged particle is driven by second force 252. In some embodiments, a length L2 of first component 210 is equal to or greater than length L0 of surface 240S. A magnitude of first force 250 or second force 252 is large enough to push charged particles away from surface 240S.

Figure 2B:
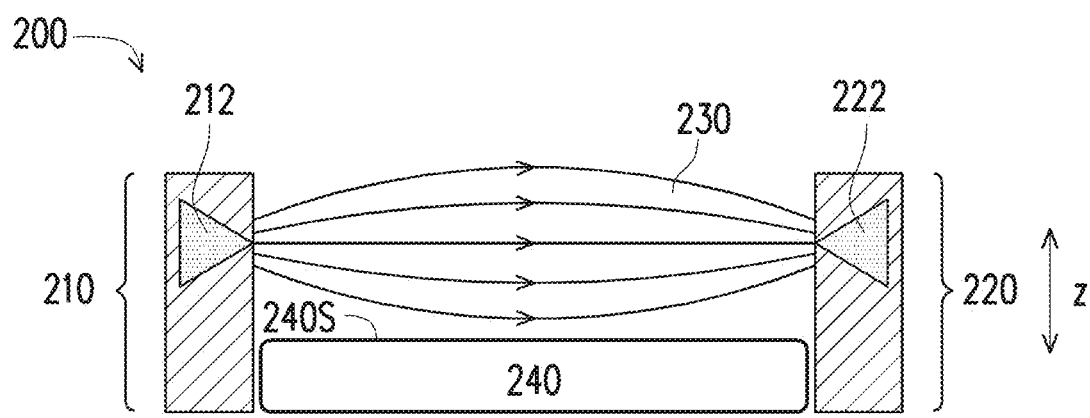
FIG. 2B is a cross-sectional view of the apparatus for generating the particle shield taken along line B-B' in FIG. 2A in accordance with one or more embodiments.

FIG. 2B is a cross-sectional view of apparatus 200 for generating particle shield 230 in accordance with one or more embodiments. In some embodiments, particle shield 230 comprises another energy gradient force, such as a thermal gradient driving force generated by a temperature difference. In at least one instance, first component 210 has a higher temperature than second component 220, resulting in a particle movement from first component 210 to second component 220. In some embodiments, first component 210 includes a North Pole magnet 212 and second component 220 includes a South Pole magnet 222. Particle shield 230 is the magnetic field symbolized by arrows. In some embodiments, surface 240 is closer to magnets 212 and 222 along direction Z than shown in FIG. 2B so that object 240 is encompassed in particle shield 230.

Figure 2C:
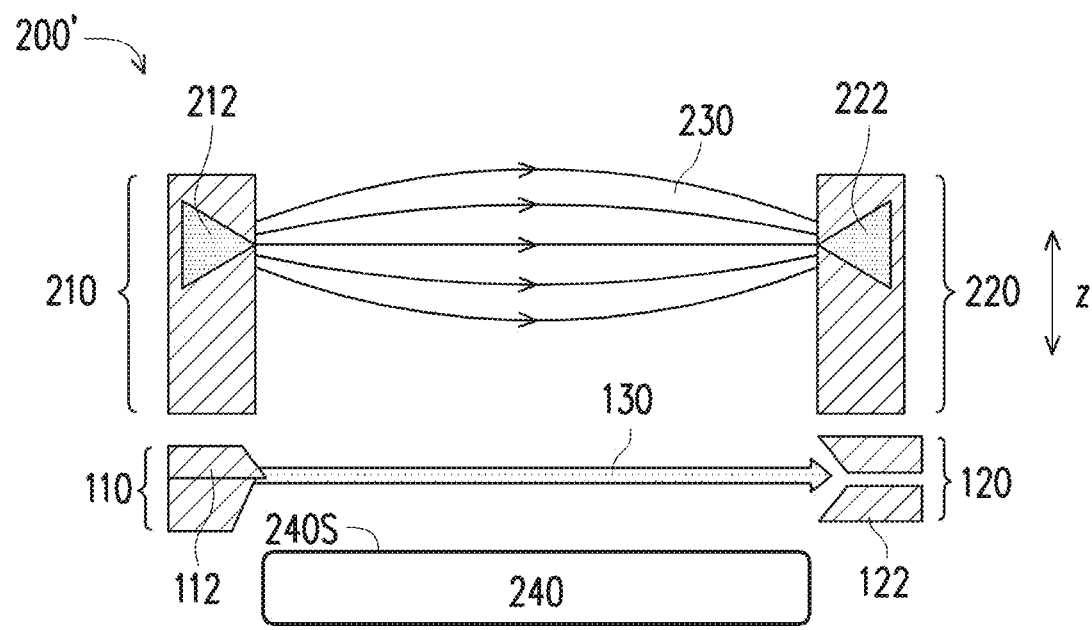
FIG. 2C is a cross-sectional view of an apparatus for generating a particle shield in accordance with one or more embodiments.

FIG. 2C is a cross-sectional view of an apparatus 200' for generating one or more particle shields in accordance with one or more embodiments. In some embodiments, a combination of the energy gradient force and the velocity dependent force is used to enhance protection from particles. For example, first component 210 including North Pole magnet 212 is above first component 110 including gas injector 112; second component 220 including South Pole magnet 222 is above second component 120. In some embodiments, first component 110 and second component 120 are above first component 210 and second component 220. Alternatively, first component 110 and second component 120 are positioned transverse to first component 210 and second component 220 similar to third component 115 and fourth component 125 in apparatus 100. In contrast with apparatus 100, because there is no interaction between the gas and magnetic field, particle shield 130 is co-planar with particle shield 230, in some embodiments.

In some embodiments, both the energy gradient force and the velocity dependent force are generated from a same component. For example, first component 210 and second component 220 are used to generate an air curtain as well as a magnetic field. One of ordinary skill in the art would understand that first component 210 or second component is not limited to an air curtain or a magnetic field. In at least one embodiment, at least one of first component 210 and second component 220 is used to generate an optical laser to burn the particles. In some embodiments, apparatus 200' includes more than two particle shields, such as a combination of an air curtain, a magnetic field and a thermal gradient driving force.

Figure 3:
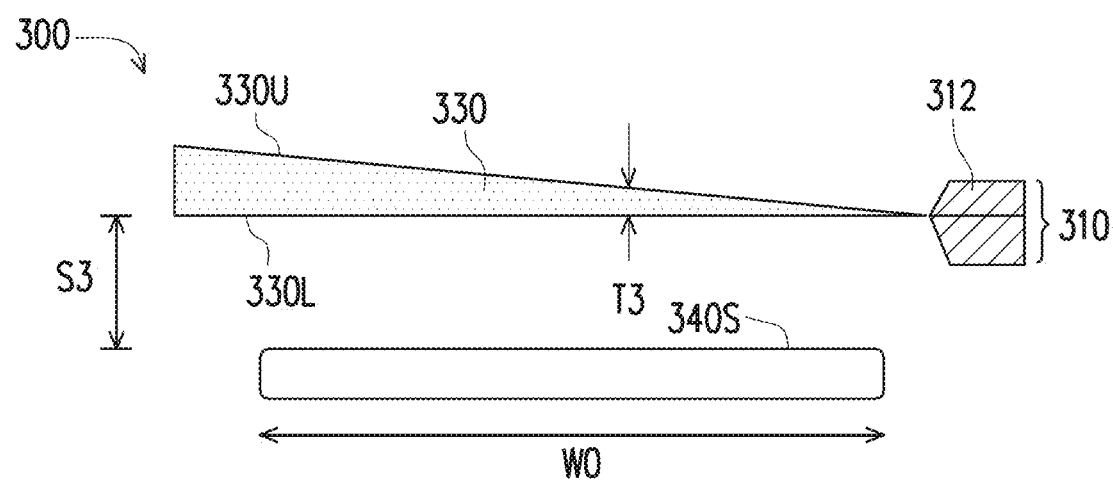
FIG. 3 is a schematic cross-sectional view of an apparatus for generating a particle shield in accordance with one or more embodiments.

FIG. 3 is an enlarged schematic view of an apparatus 300 for generating a particle shield 330, also referred to as a particle shield generator, in accordance with one or more embodiments. Apparatus 300 is similar to apparatus 100, like elements having a same reference number increased by 200. Apparatus 300 includes a first component 310. In some embodiments, first component 310 is a gas injector 312. Gas injector 312 generates particle shield 330, which includes an upper surface 330U and a lower surface 330L. A thickness T3 of particle shield 330 is defined by a distance between upper surface 330U and lower surface 330L. In various embodiments, a particle shield 330 provides an air curtain in direction X along width W0 to help block particles and thickness T3 is modified by several parameters such as gas density, molecular weight, and velocity of gas fluid. In some embodiments, thickness T3 ranges from about 1 mm to about 90 mm. For example, at an end of particle shield 330 extending to 152 mm (6 inches), thickness T3 ranges from 25.4 mm to around 38.1 mm. Due to a low density of particle shield 330, thicker thickness T3 reduces a functionality of particle shield 330, in some instances. In some embodiments, upper surface 330U is substantially tilted up and has an angle ranging from about 5-degrees to about 11-degrees above direction X and lower surface 330L is parallel to a surface 340S. Incoming particles are pushed away from surface 340S. Due to a large gradient, particle shield 330 is likely to contact an edge of surface 340S, in some instances. In order to help prevent lower surface 330L of particle shield 330 from contacting surface 340S, component 310 is designed to maintain a spacing S3 between lower surface 330L and surface 340S and may be larger than a maximum value of thickness T3.

In comparison with apparatus 100, apparatus 300 does not include a second component. The second component is omitted from apparatus 300 because a force of the gas ejected from first component 312 is sufficiently strong to block particles without the added assistance of the second component. In some embodiments, a device housing apparatus 300 and surface 340S has an opening across from first component 312 to permit particles to be forced out of the device. In some embodiments, apparatus 300 includes the second component. In some embodiments, first component 312 is separated into multiple first components as in apparatus 100' (FIG. 1C).

Figure 4:
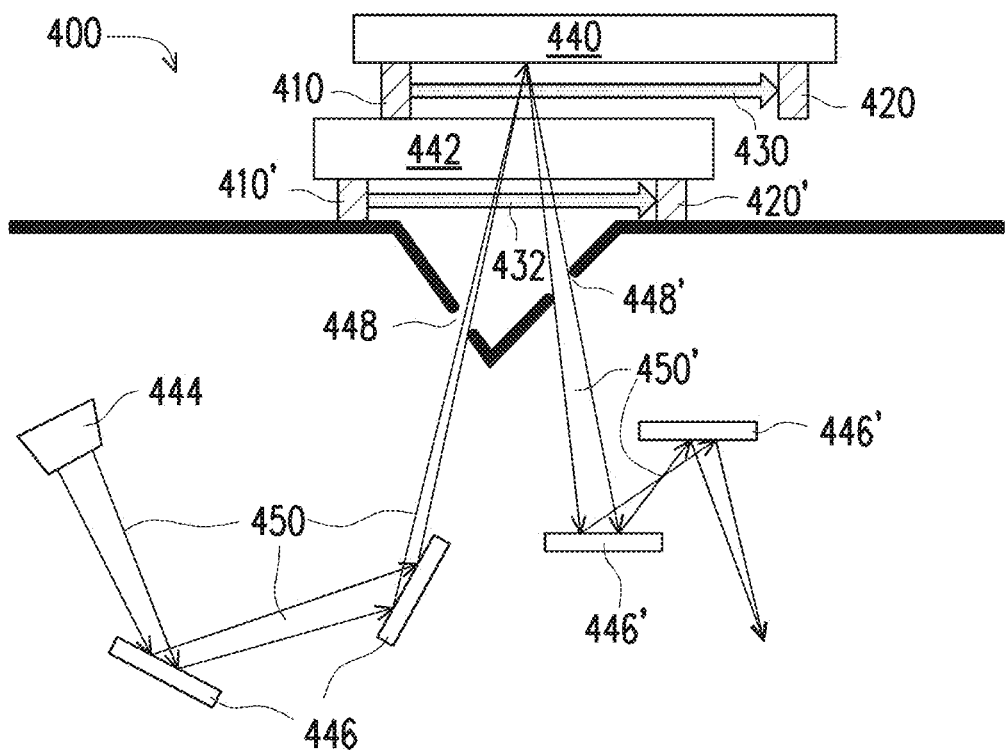
FIG. 4 is a schematic view of a photolithography system in accordance with one or more embodiments.

FIG. 4 is a schematic view of a photolithography system 400 in accordance with one or more embodiments. Photolithography system 400 includes an apparatus for generating a particle shield similar to apparatus 100 (or apparatus 100', 100", 200, 200' and 300), last two digits of like elements are the same. Photolithography system 400 includes a photomask 440, a slit 442, a radiation source 444, a plurality of reflectors or mirrors 446 and 446' and a set of apertures 448 and 448'. A beam of optical energy 450 is generated by radiation source 444, propagates along an optical path to reflectors 446, aperture 448 and slit 442 to photomask 440. Optical energy 450 is reflected by photomask 440, and propagates through slit 442, aperture 448' and reflectors 446'. Reflectors 446' reduce an image from photomask 440 for forming an image onto a wafer. In some embodiments, a distance between photomask 440 and slit 442 ranges from about 10 mm to about 100 mm. Apparatus 400 includes a catoptric imaging system. In some embodiments, apparatus 400 includes a catadioptric imaging system.

Photolithography system 400 further includes a first component 410, a second component 420, a third component 410' and a fourth component 420'. A first particle shield 430 is between first component 410 and second component 420. A second particle shield 432 is between third component 410' and fourth component 420'. First component 410 and second component 420 are between photomask 440 and slit 442. Third component 410' and fourth component 420' are between slit 442 and apertures 448 and 448'. Both first particle shield 430 and second particle shield 432 help prevent particles or contaminants from adhering or falling onto photomask 440 and/or slit 442. In some embodiments, both first particle shield 430 and second particle shield 432 include a gas stream. For example, first particle shield 430 and second particle shield 432 includes hydrogen, ambient air, helium, nitrogen or inert gases. In some embodiments, first particle shield 430 and second particle shield 432 include different gases. In some embodiments, a size of first particle shield 430 and second particle shield 432 ranges from four inches by four inches to six inches by six inches. In some embodiments, a size of first particle shield 430 and second particle shield 432 is greater than six inches by six inches. In some instances, a greater size of first particle shield 430 increases a size of photomask container. In some instances, a greater size of first particle shield 430 cannot fit in photolithography system 400. A smaller size causes the coverage for photomask 440 to be insufficient to block particles from contacting photomask 440. In some embodiment, a thickness of first particle shield 430 and second particle shield 432 ranges from about 1 mm to about 35 mm. In some embodiments, first particle shield 430 and second particle shield 432 include a combination of the energy gradient force and the velocity dependent force. For example, first particle shield 430 includes a gas and second particle shield 432 includes an electromagnetic Lorentz force. In various embodiments, depending on a requirement of cleanliness, one or more sets of components for generating particles shields are positioned proximate a surface of any of radiation source 444, reflectors 446, 446', apertures 448, 448' or the wafer. In some embodiments, photolithography system 400 includes apparatus 100, 100', 100", 200, 200', 300, or combinations therefor.

In some embodiments, photolithography system 400 is an extreme ultraviolet (EUV) exposure scanner and slit 442 is a REMA. In some instances, photomask 440 is also called a reticle or a mask. In some embodiments, radiation source 444 is created by plasma when a laser illuminates a gas, such as a xenon gas jetted away in a speed faster than a speed of sound in air (about 340 m/s). For example, radiation source 444 provides EUV radiation having a wavelength of approximately 13.5 nm. In some embodiments, when first particle shield 430 and second particle shield 432 include gas, a transmission loss between the beam of optical energy 450 and 450' ranges from about 0.011% to about 0.022%. In some embodiments, the gas has a low absorption of optical energy 450. A greater transmission loss reduces the exposure of layout patterns on the wafer. In some embodiments, photolithography system 400 is an X-Ray lithography, an ion beam projection lithography, or an electron-beam projection lithography.

Figure 5:
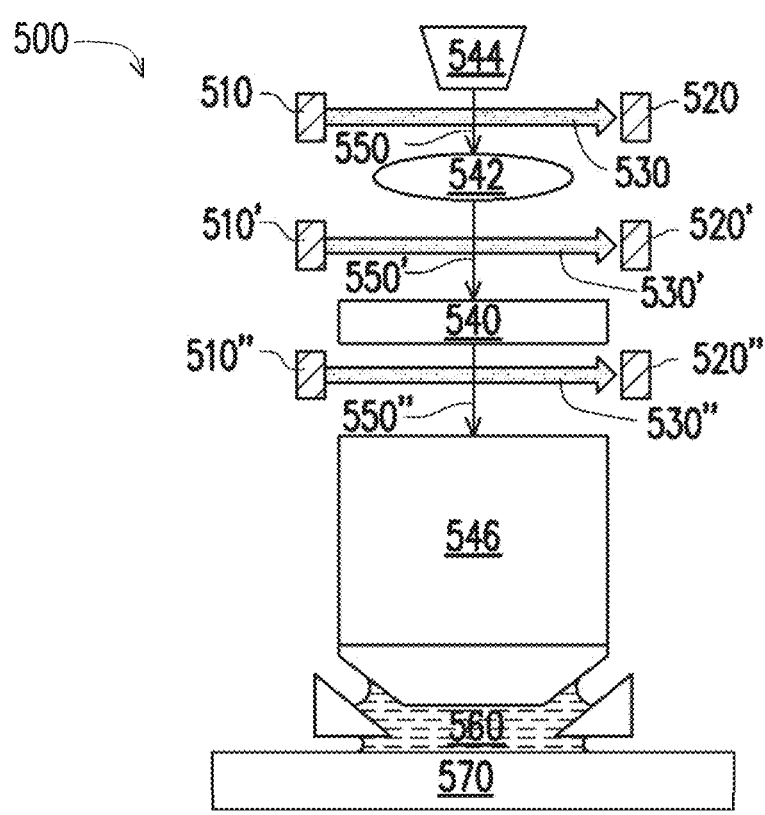
FIG. 5 is a schematic view of a photolithography system in accordance with one or more embodiments.

FIG. 5 is a schematic view of a photolithography system 500 in accordance with one or more embodiments. Photolithography system 500 includes an apparatus similar to apparatus for generating a particle shield 100 (or apparatus 100', 100", 200, 200' and 300), last two digits of like elements having a same reference number are the same. Photolithography system 500 includes a photomask 540, a lens 542, a radiation source 544, an imaging module 546 and fluid 560. A first component 510, a second component 520 and a first particle shield 530 are between radiation source 544 and lens 542. A third component 510', a fourth component 520' and a second particle shield 530' are between lens 542 and photomask 540. A fifth component 510", a sixth component 520" and a third particle shield 530" are between photomask 540 and imaging module 546. Radiation source 544 emits a beam of optical energy 550 through first particle shield 530 and lens 542. A beam of optical energy 550' is then passed through second particle shield 530' and photomask 540. A beam of optical energy 550" is then passed through third particle shield 530" and imaging module 546. A fluid 560 fills at least a space between imaging module 546 and a wafer 570. In some embodiments, each of first particle shield 530, second particle shield 530' and third particle shield 530" independently includes a gas fluid or the velocity dependent force. In some embodiments, photolithography system 500 includes apparatus 100, 100', 100", 200, 200', 300, or combinations therefor.

In some embodiments, photolithography system 500 is an immersion photolithography system. In some embodiments, similar to photolithography system 400, each of first particle shield 530, second particle shield 530' and third particle shield 530" include the energy gradient force, the velocity dependent force, or combinations thereof. In at least one embodiment, when first particle shield 530, second particle shield 530' and third particle shield 530" consist of gas fluid, a photon transmission loss between the beam of optical energy 550 and 550' ranges from about 0.011% to about 0.033%. In various embodiments, depending on a requirement of cleanliness, one or more sets of components are positioned on selected surfaces in photolithography system 500.

In some embodiments, apparatus 100, 100', 100", 200, 200', 300 is arranged above selected surface during other manufacturing process line, such as a standard mechanical interface (SMIF) pod station or a spectra critical dimension equipment, photoresist spinner, or wet spray etcher.

Figure 6:
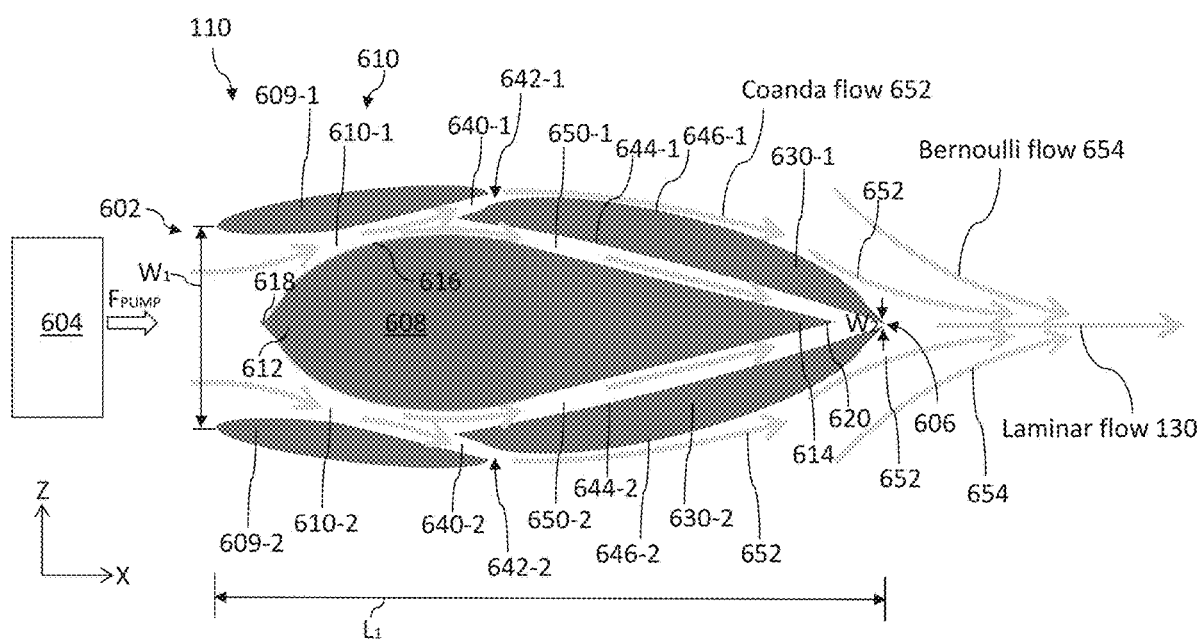
FIG. 6 is a schematic cross-sectional view of an injection nozzle for generating a particle shield in accordance with one or more embodiments.

FIG. 6 is a cross-sectional view of an example first component 110 for generating particle shield 130 taken along line B-B' in FIG. 1A. In the illustrated embodiment, the first component 110 receives gas or fluid supply from a supply port 602 which is coupled to a supply source 604 and injects the particle shield 130 from a main outlet 606. The first component 110 may also be referred to as an injection nozzle 110. In some embodiments, the supply source 604 is a gas pump providing ambient air, nitrogen, hydrogen, inert gas, or combinations thereof. The gas pump 604 pumps a gas flow into the supply port 602 with a driving force denoted as $F_{pump}$. The gas flow is subsequently jetted away from the main outlet 606, forming the particle shield 130. The particle shield 130 formed of gas molecules may also be referred to as a non-solid materialistic particle air shield. In some embodiments, the particle shield 130 is a laminar flow. A laminar flow is termed as a fluid or gas that flows in parallel layers with substantially no disruption (e.g., eddies or turbulences) between the layers. In the illustrated embodiment, the particle shield 130 is a laminar jet flow that has a strong momentum when leaving the main outlet 606 and can travel a long distance into a surrounding medium without substantially dissipating.

The injection nozzle 110 has a flow splitter 608 between two side covers 609-1 and 609-2. The flow splitter 608 and the two side covers 609-1 and 609-2 form an upper sub-channel 610-1 and a lower sub-channel 610-2 respectively, which are collectively denoted as the channel 610. The gas flow from the supply port 602 is split into two equal streams into the two sub-channels 610-1 and 610-2. In some embodiments, the flow splitter 608 may split the gas flow into three or more sub-channels. In the illustrated embodiment, the flow splitter 608 has a shape of tear-drop with a wider end 612 facing the supply port 602 and a narrower end 614 facing the main outlet 606. The wider end 612 and the narrow end 614 are connected by a smooth surface 616. The smooth surface 616 also provides an internal sidewall to the channel 610. The smooth surface 616 may have a curvy shape. In a region close to the narrow end 614, a portion of the smooth surface 616 may be a flat surface. In one example, the wider end 612 has a tip 618 that is rounded. In yet another example, the tip 618 is pointed. The shape of the tip 618 relies on the specific need of fluid dynamic control in various applications. Similarly, the narrower end 614 has a tip 620 that can be either rounded or pointed. In a specific embodiment, the wider end 612 has a rounded tip 618 which avoids eddies during gas flow splitting, and the narrower end

614 has a pointed tip 620 which facilitates gas flow emergence in a narrow region proximate to the opening of the main outlet 606.

Along the air flow path, the injection nozzle 110 further includes two side flow splitters 630-1 and 630-2. The side flow splitter 630-1 forms a side channel 640-1 with the side cover 609-1 and forms an internal channel 650-1 with the flow splitter 608. The gas stream from the sub-channel 610-1 is further split (e.g., equally) into two streams into the side channel 640-1 and the internal channel 650-1. The side flow splitter 630-2 forms a side channel 640-2 with the side cover 609-2 and forms an internal channel 650-2 with the flow splitter 608. The gas stream from the sub-channel 610-2 is further split (e.g., equally) into two streams into the side channel 640-2 and the internal channel 650-2. In some embodiments, the side flow splitter 630-1 (630-2) splits more air flow into the internal channel 650-1 (650-2) than into the side channel 640-1 (640-2), such as a volumetric ratio of about 70% : 30% for the air flow into the internal channel 650-1 (650-2) and the side channel 640-1 (640-2) in one example. The side channel 640-1 connects to a side outlet 642-1. The side channel 640-2 connects to a side outlet 642-2. The air flow in the side channel 640-1 and 640-2 is thereby blown out from the side outlets 642-1 and 642-2 respectively and enters a proximate region external to the injection nozzle 110. In some embodiments, each opening of the side outlets 642-1 and 642-2 has a length about 0.1 mm. The side flow splitter 630-1 has an internal surface 644-1 and an external surface 646-1. The side flow splitter 630-2 has an internal surface 644-2 and an external surface 646-2. The external surfaces 646-1 and 646-2 each is a convex surface. The air flow blown out from the side outlets 642-1 and 642-2 has a tendency to stay attached to the adjacent convex surfaces 646-1 and 646-2 due to the Coanda effect, thereby forming two Coanda flows 652 flowing along the external surface 646-1 and 646-2 towards the main outlet 606. The internal surfaces 644-1 and 644-2 each may be a flat surface or a convex surface which provides an internal sidewall for the internal channels 650-1 and 650-2, respectively. The external surfaces 646-1 and 646-2 have a longer contour length than the internal surface 644-1 and 644-2, respectively. Therefore, the Coanda flow 652 has a faster flowing speed than the air flow remaining in the internal channels 650-1 and 650-2. Consequently, an air pressure proximate to the external surfaces 646-1 and 646-2 is lower than an air pressure inside the internal channels 650-1 and 650-2, respectively. In some embodiments, the opening of the side outlets 642-1 and 642-2 is narrower than a cross-sectional opening of the side channels 640-1 and 640-2 respectively, which jets an even higher speed Coanda flow 652 through the side outlets 642-1 and 642-2. In some other embodiments, the side channels 640-1 and 640-2 are not split from the sub-channels 610-1 and 610-2 but individually connected to a separate gas pump (not shown) different from the gas pump 604. This separate gas pump individually controls the volume and velocity of the Coanda flow 652.

The Coanda flow 652 has a higher momentum compared to the surrounding air. The surrounding air is carried along with the Coanda flow 652 due to viscosity. In fluid dynamics, Bernoulli's principle states that an increase in the speed of a fluid occurs simultaneously with a decrease in pressure. Therefore, a low pressure region is created proximate to the external surfaces 646-1 and 646-2. The air pressure increases in a gradient away from the external surfaces 646-1 and 646-2. This air pressure gradient compresses surrounding air towards the external surfaces 646-1 and 646-2 and the main outlet 606, creating a new air flow sourced from an external region of the injection nozzle 110. This air flow is referred to as a Bernoulli flow 654.

In some embodiments, the injection nozzle 110 has a length measured from the opening of the main outlet 606 to the opening of the supply port 602, denoted as $L_1$, in a range from about 10 mm to about 30 mm, such as about 12 mm. The opening of the main outlet 606 is significantly smaller than the opening of the supply port 602. For example, a length of the opening of the supply port 602 over that of the main outlet 606 ranges from about 4:1 to about 40:1. In some embodiments, the opening of the main outlet 606 is less than 1 mm in direction Z (denoted as $W_2$), such as from about 0.1 mm to about 0.5 mm. In some embodiments, the opening of the supply port 602 is from about 2 mm to about 4 mm in direction Z (denoted as $W_1$), such as about 2.5 mm. The opening of the main outlet 606 is also significantly smaller than the size of the internal channel 650-1 or 650-2. The gas flow from the internal channels 650-1 and 650-2 merge in a region near the tip 620 and is jetted away from the main outlet 606, forming the laminar flow 130. In a proximate region outside of the main outlet 606, the Coanda flow 652 entrains and compresses the laminar flow 130 from both upper and lower sides to restrain the laminar flow 130 from dispersion. Furthermore, the Bernoulli flow 654 also compresses the Coanda flow 652 and the laminar flow 130 from both sides. By synergetically integrating both Coanda effect and Bernoulli effect, the injection nozzle 110 is configured to generate a laminar flow 130 with an ultra-thin thickness. In some embodiments, the laminar flow 130 has a thickness less than 1 mm, such as about 0.5 mm. The thickness of the laminar flow 130 is defined by full width at half maximum (FWHM) of a flow velocity distribution. For example, if the laminar flow 130 has the highest flow velocity $v_0$ at the center of the flow and at 0.25 mm away from the center the flow velocity decreases to $v_0/2$, the laminar flow 130 is regarded as having a 0.5 mm (0.25 mm×2) thickness. In some embodiments, the Coanda flow 652 and Bernoulli flow 654 merge into the laminar flow 130 and become part of the particle shield 130.

Figure 7A:
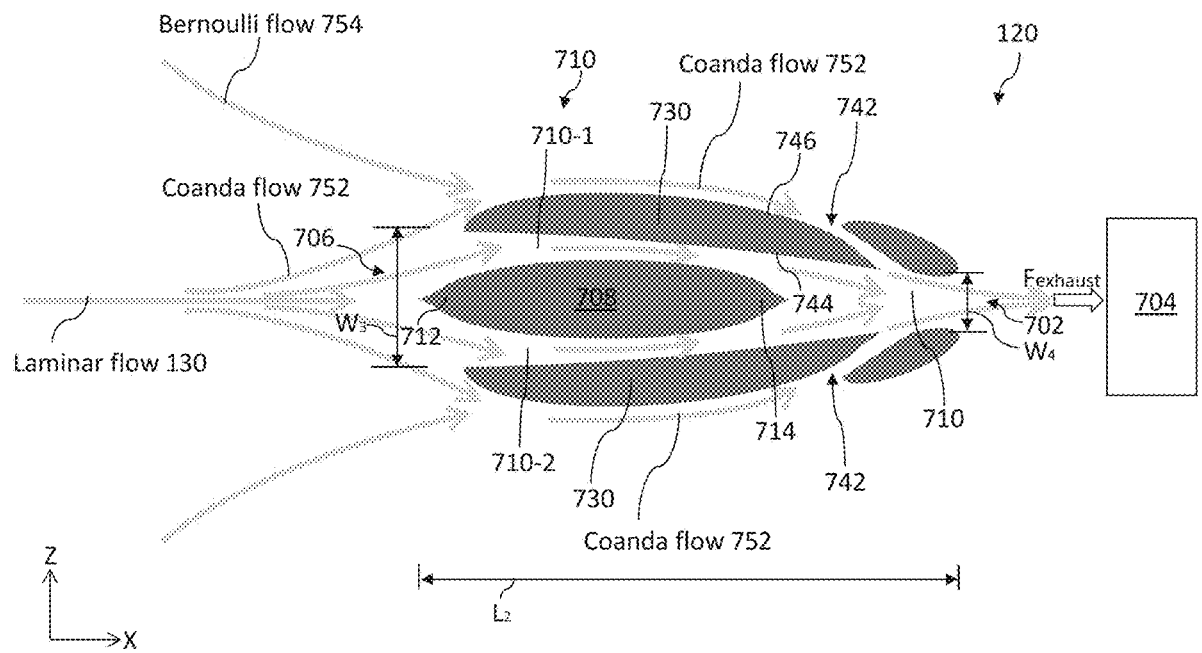
FIG. 7A and 7B are schematic cross-sectional views of a suction nozzle for generating a particle shield in accordance with various embodiments.

FIG. 7A is a cross-sectional view of an example second component 120 for receiving the particle shield 130, taken along line B-B' in FIG. 1A. In the illustrated embodiment, the second component 120 is aligned at the same level in direction Z with the injection nozzle 110, providing a gas pressure gradient for the particle shield 130. After traveling a distance away from the injection nozzle 110, the laminar flow 130 starts to dissipate in direction Z. One phenomenon is the flow velocity decreases and the thickness of the laminar flow 130 increases. The second component 120 helps to compress the laminar flow 130 at a receiving (or retrieving) end. The second component 120 has an exhaust port 702 coupled to an exhaust pump 704. In some embodiments, the exhaust pump 704 is a vacuum pump. The exhaust pump 704 provides a suction force $F_{exhaust}$, which attracts the laminar flow 130 to flow into the main inlet 706 and go through the exhaust port 702 subsequently. The second component 120 may also be referred to as a suction nozzle 120. In some embodiments, the suction force $F_{exhaust}$ is larger than the driving force $F_{pump}$ provided by the gas pump 604 at the other end of the injection nozzle 110. A larger suction force $F_{exhaust}$ allows the suction nozzle 120 to better collect the dissipating gas molecules in the laminar flow 130. In one example, the suction force $F_{exhaust}$ is about 1.5 to 3 times of the driving force $F_{pump}$, such as about 2 times. Since the thickness of the laminar flow 130 gradually increases along a propagation path from the injection nozzle 110 to the suction nozzle 120, the main inlet 706 also has a larger opening area than the main outlet 606 to better collect the dissipating gas molecules. In some embodiments, the main inlet 706 has a cross-sectional opening area about 2 to 20 times of the main outlet 606, such as about 3 times in one example. In some alternative embodiments, the main inlet 706 has a length of the opening similar to that of the main outlet 606. As an example, the opening of the main inlet 706 may be from about 2 mm to about 4 mm in direction Z (denoted as $W_3$), such as about 2.5 mm. The opening of the exhaust port 702 may be from about 0.5 mm to about 2 mm in direction Z (denoted as $W_4$).

The exhaust pump 704 creates a pressure gradient between the injection nozzle 110 and the suction nozzle 120. This pressure gradient drives the laminar flow 130 into the main inlet 706. The main inlet 706 couples to a channel 710 that guides the gas flow to the exhaust port 702. In some embodiments, the channel 710 comprises two or more sub-channels, such as an upper sub-channel 710-1 and a lower sub-channel 710-2 in the illustrated embodiment. The suction nozzle 120 has a flow splitter 708 that equally splits the gas flow into the upper sub-channel 710-1 and the lower sub-channel 710-2. The flow splitter 708 regulates the flow direction and flow velocity of the gas molecules at the retrieving end of the laminar flow 130. In the illustrated embodiment, the flow splitter 708 has a spindle shape tapering at both ends 712 and 714. The end 712 and the end 714 may each individually have a rounded tip or a pointed tip. The selection of the shape of the tips relies on the specific need of fluid dynamic control in various applications. In the illustrated embodiment, both ends 712 and 714 have a pointed tip. In the illustrated embodiment, the end 712 extends out of the opening of the main inlet 706, and a length of the suction nozzle 120 measured from the pointed tip of the end 712 to the opening of the exhaust port 702 (denoted as $L_2$) ranges from about 10 mm to about 30 mm, such as about 12 mm. In some other embodiments, the end 712 does not extend out of the opening of the main inlet 706, and the length $L_2$ measured from the opening of the main inlet 706 to the opening of the exhaust port 702 ranges from about 10 mm to about 30 mm, such as about 12 mm.

The suction nozzle 120 has one or more side inlets 742 opened at its external surface. The side inlet(s) 742 couples to the exhaust pump 704 through the channel 710. A pressure gradient is thus created at an area surrounding the side inlet 742 and inside the channel 710. This pressure gradient drives a gas flow along an external surface 746 of a side flow splitter 730. There may be one or more side flow splitters 730 in various embodiments (e.g., two side flow splitters 730 are illustrated in FIG. 7). The side flow splitter 730 further has an internal surface 744. The external surface 746 is a convex surface. The air flow extracted into the side inlet 742 has tendency to stay attached to the adjacent convex surface 746 due to the Coanda effect, thereby forming Coanda flow 752 flowing along the external surface 746 from the main inlet 706 towards the side inlet 742. The internal surface 744 may be a flat surface or a convex surface which provides an internal sidewall for the channel 710. The external surface 746 has a longer contour length than the internal surface 744. Therefore, the Coanda flow 752 has a faster flowing speed than the air flow inside the channel 710. Consequently, an air pressure proximate to the external surface 746 is lower than an air pressure inside the channel 710. In some embodiments, a volumetric ratio between the gas flow through the side inlet 742 and the main inlet 706 is about 1:1. In some embodiments, the main inlet 706 has larger gas flow intake than the side inlet 742.

In the illustrated embodiment, the gas flow inside the sub channels 710-1 and 710-2 merges in a region near the end 714 of the flow splitter 708, and then the merged gas flow further merges with the Coanda flow 752 in the channel 710. In some embodiments, the side inlet 742 is open at a position between the main inlet 706 and the end 714 of the flow splitter 708, such that the gas flow inside the sub channels 710-1 and 710-2 each individually merges with a Coanada flow 752 before the two sub-channels 710-1 and 710-2 merge. In yet another embodiment, the side inlet 742 does not couple to the channel 710 or the exhaust pump 704, but individually connected to a separate exhaust pump (not shown) different from the exhaust pump 704. This separate exhaust pump individually controls the volume and velocity of the Coanda flow 752.

The Coanda flow 752 has a higher momentum compared to the surrounding air. The surrounding air is carried along with the Coanda flow 752 due to viscosity, but with less momentum. In fluid dynamics, Bernoulli's principle states that an increase in the speed of a fluid occurs simultaneously with a decrease in pressure. Therefore, a low pressure region is created proximate to the external surface 746. Away from the external surface 746, the air pressure increases. This air pressure gradient compresses surrounding air towards the external surface 746 and the main outlet 706, creating a new air flow sourced from an external region of the suction nozzle 120. This air flow is referred to as a Bernoulli flow 754.

In a proximate region outside of the main inlet 706, the Coanda flow 752 entrains and compresses the laminar flow 130 from both upper and lower sides to restrain the laminar flow 130 from dispersion. Furthermore, the Bernoulli flow 754 also compresses the Coanda flow 752 and the laminar flow 130 from both sides. By synergistically integrating both Coanda effect and Bernoulli effect, the suction nozzle 120 is able to maintain the laminar flow 130 with an ultra-thin thickness even at the end of the propagation path. In some embodiments, the laminar flow 130 is maintained with a thickness about 0.5 mm close to the injection nozzle 110 and a thickness less than about 0.75 mm close to the suction nozzle 120.

Figure 7B:
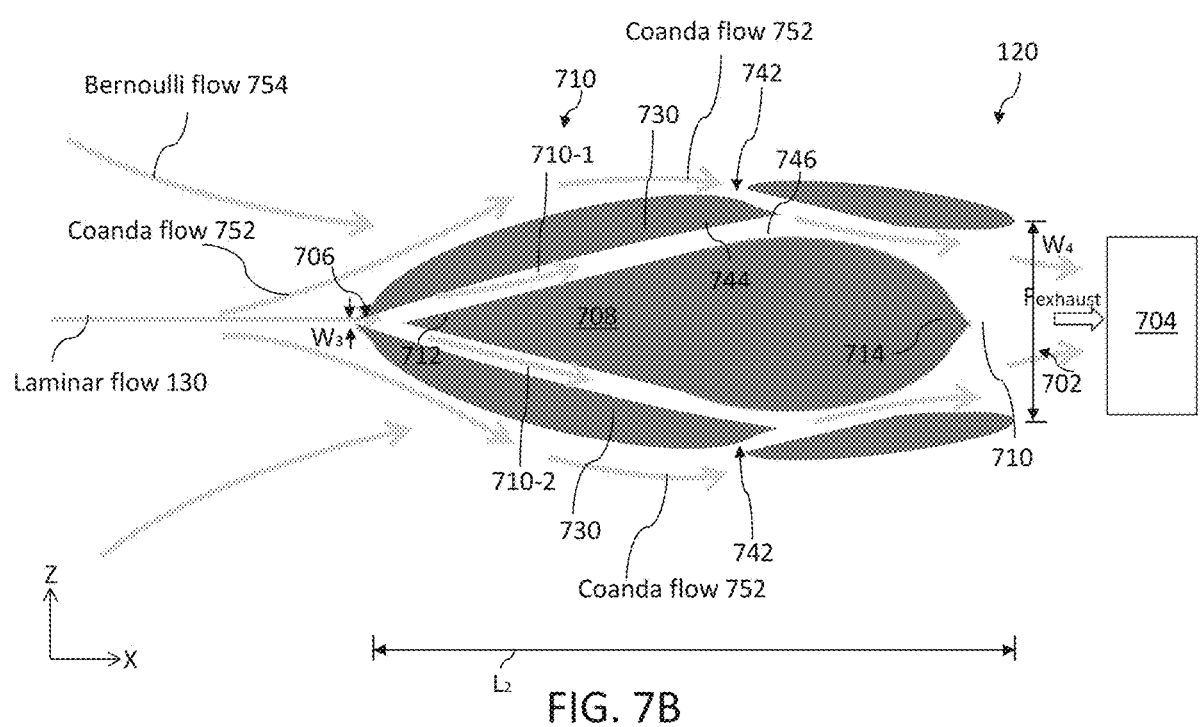

FIG. 7B illustrate another embodiment of the suction nozzle 120, which is essentially using the same injection nozzle 110 as shown in FIG. 6 but flipping the supply port 602 (FIG. 6) to couple to the exhaust pump 704, such that the internal flow direction is reversed and the supply port 602 becomes the exhaust port 702 and the main outlet 606 (FIG. 6) becomes the main inlet 706. By reusing the injection nozzle as the suction nozzle, system setup is simplified. The dimensions of the suction nozzle 120, such as length ($L_2$), opening of the main inlet 706 ($W_3$), and opening of the exhaust port 702 ($W_4$) are essentially the same as those of the injection nozzle 110 in FIG. 6 (i.e., $L_2=L_1$, $W_3=W_2$, $W_4=W_1$). Comparing the opening of the main inlet 706 ($W_3$) in FIGS. 7A and 7B, although the opening in FIG. 7B is smaller, coupled from the exhaust pump 704, a smaller opening provides a stronger suction power directly facing the injection nozzle on the other side than that of a bigger opening, which also maintains a thin laminar flow 130. In some other embodiments, the opening of the main inlet 706 ($W_3$) may be even smaller than the opening of the main outlet 606 ($W_2$).

Figure 8:
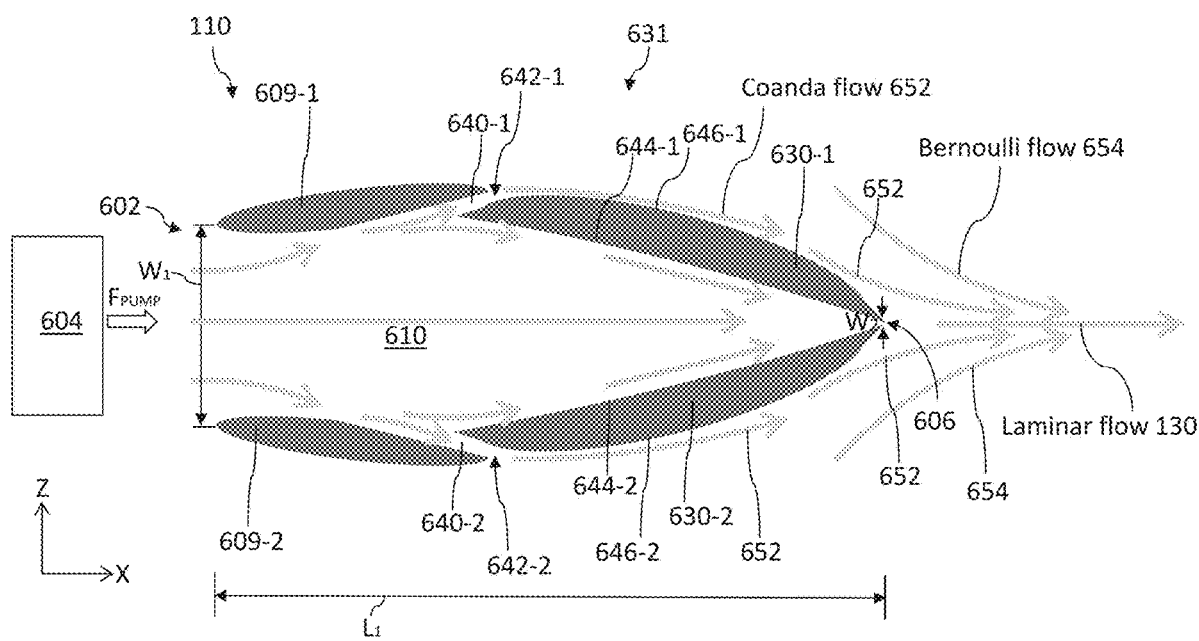
FIG. 8 is a schematic cross-sectional view of another injection nozzle for generating a particle shield in accordance with one or more embodiments.
Figure 9A:
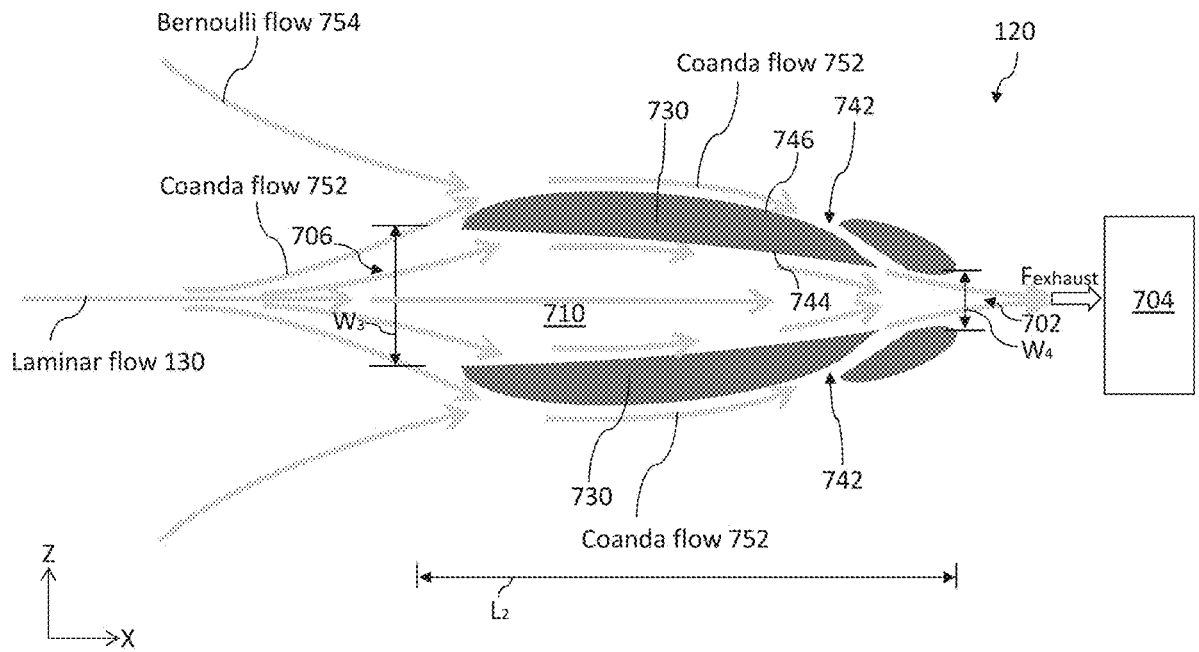
FIG. 9A and 9B are schematic cross-sectional views of another suction nozzle for generating a particle shield in accordance with various embodiments.
Figure 9B:
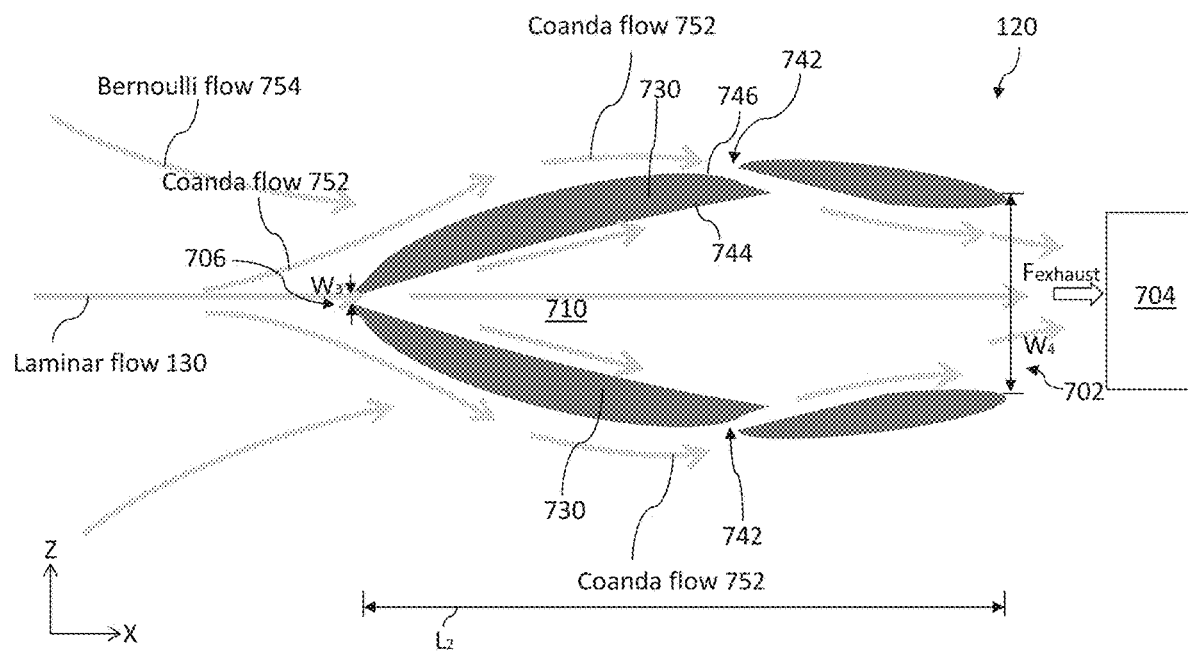
Figures 10A, 10B, 10C, 10D:
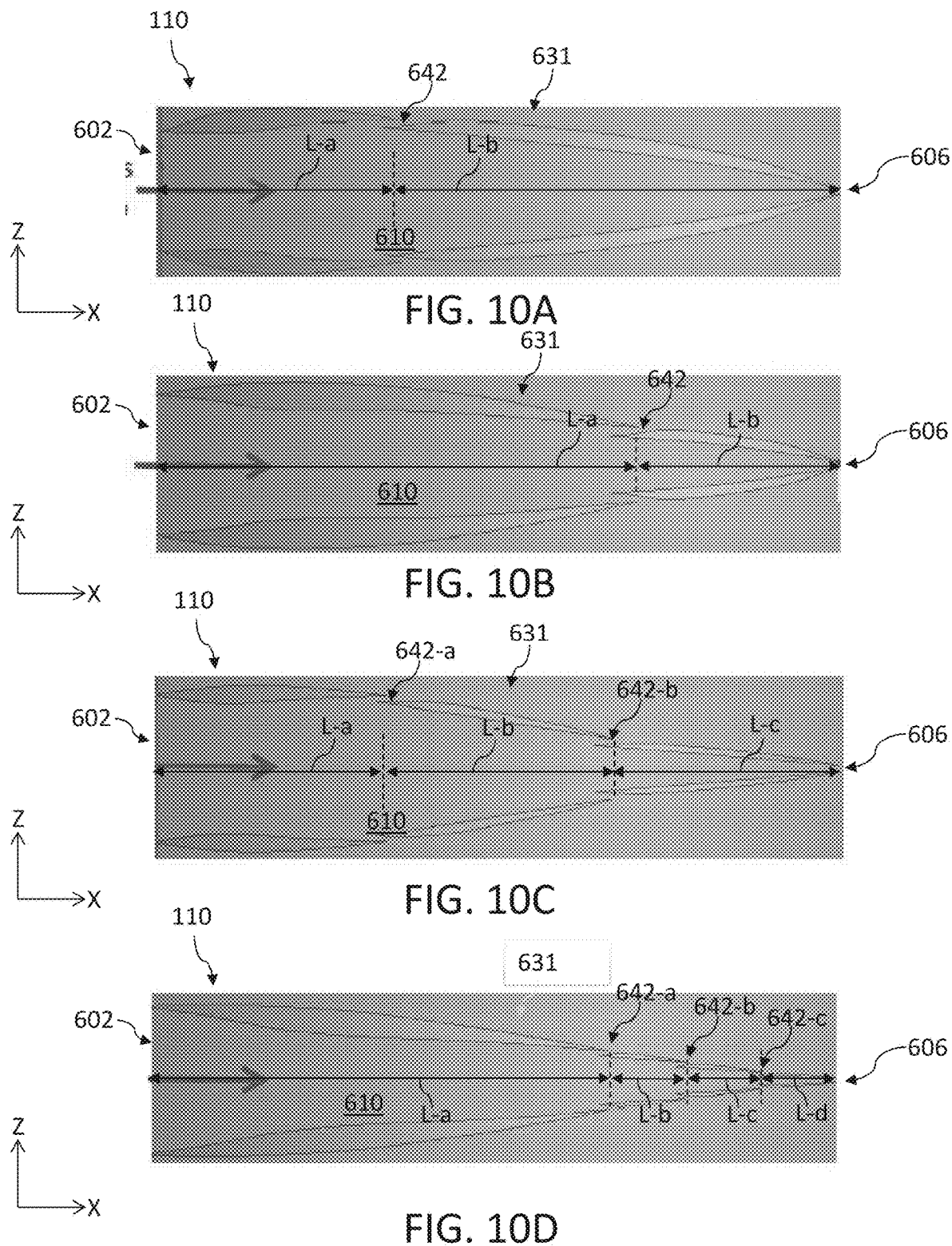
FIG. 10A, 10B, 10C, and 10D are schematic cross-sectional views of injection nozzles in accordance with various embodiments.

FIGS. 8, 9A-B illustrate other embodiments of the injection nozzle 110 and the suction nozzle 120. The injection nozzle 110 in FIG. 8 and the suction nozzle 120 in FIG. 9 are similar to those nozzles discussed with reference to FIGS. 6 and 7A-B, respectively. Reference numerals are repeated in FIGS. 8 and 9A-B for ease of understanding.

Comparing the injection nozzles 110 in FIG. 8 and FIG. 6, one difference is that the injection nozzle 110 in FIG. 8 does not have the flow splitter 608. Without the flow splitter 608, the sub-channels 610-1/610-2 and internal channels 650-1/650-2 (FIG. 6) merge into one gas/fluid communication channel 610. The side covers 609-1 (609-2) and side flow splitter 630-1 (630-2) surround the channel 610 and can be regarded as jointly providing a sidewall 631 to the channel 610. In other words, the side covers 609-1 (609-2) and side flow splitter 630-1 (630-2) can be regarded as one sidewall 631 being divided by the side channel 640-1 (640-2) and the side outlet 642-1 (642-2) into two segments. In some embodiments, the sidewall 631 is one continuous segment but providing a side opening (such as a slot) to form the side channel 640-1 (640-2) and the side outlet 642-2 (642-2). Through the channel 610, a portion of the gas stream into the supply port 602 travels in a straight line pointing from the opening of the supply port 602 to the opening of the main outlet 606. Other portions of the gas stream travel along regions proximate to the inner sidewalls of the side covers 609-1/609-2 and the side flow splitter 630-1/630-2. The side outlets 642-1/642-2 excite Coanda flow 652 along external surfaces of the injection nozzle 110, which further excites Bernoulli flow 654 in proximate regions of the main outlet 606. The Coanda flow 652 and the Bernoulli flow 654 jointly compress the laminar flow 130 to achieve an ultra-thin thickness, such as less in 1 mm defined by full width at half maximum (FWHM) of a flow velocity distribution of the particle shield.

Comparing the suction nozzles 120 in FIG. 9A and FIG. 7A, one difference is that the suction nozzle 120 in FIG. 9A does not have the flow splitter 708. Without the flow splitter 708, the sub-channels 710-1 and 710-2 (FIG. 7A) merge into one gas/fluid communication channel 710. A portion of the gas stream into the main inlet 706 travels in a straight line pointing from the opening of the main inlet 706 to the opening of the exhaust port 702. Other portions of the gas stream into the main inlet 706 travel along regions proximate to the inner sidewalls of the side flow splitter 730. The side inlets 742 excite Coanda flow 752 along external surfaces of the suction nozzles 120, which further excites Bernoulli flow 754 in proximate regions of the main inlet 706. The Coanda flow 752 and the Bernoulli flow 754 jointly compress the laminar flow 130 from further spreading after traveling a distance from the injection nozzle 110.

Similar to the suction nozzle 120 in FIG. 7B, FIG. 9B illustrate another embodiment of the suction nozzle 120, which is essentially using the same injection nozzle 110 as shown in FIG. 8 but flipping the flipping the supply port 602 (FIG. 8) to couple to the exhaust pump 704, such that the internal flow direction is reversed and the supply port 602 becomes the exhaust port 702 and the main outlet 606 (FIG. 8) becomes the main inlet 706. By reusing the injection nozzle as the suction nozzle, system setup is simplified. The dimensions of the suction nozzle 120, such as length ($L_2$), opening of the main inlet 706 ($W_3$), and opening of the exhaust port 702 ($W_4$) are essentially the same as those of the injection nozzle 110 in FIG. 8 (i.e., $L_2=L_1$, $W_3=W_2$, $W_4=W_1$). Comparing the opening of the main inlet 706 ($W_3$) in FIGS. 9A and 9B, although the opening in FIG. 9B is smaller, coupled from the exhaust pump 704, a smaller opening provides a stronger suction power directly facing the injection nozzle on the other side than that of a bigger opening, which also maintains a thin laminar flow 130. In some other embodiments, the opening of the main inlet 706 ($W_3$) may be even smaller than the opening of the main outlet 606 ($W_2$).

FIGS. 10A-10D illustrate some other embodiments of the injection nozzle 110. The injection nozzle 110 in FIG. 10A is similar to the one discussed in FIG. 8. The injection nozzle 110 has sidewalls 631 defining the gas/fluid communication channel 610 therewithin. The channel 610 couples the supply port 602 to the main outlet 606. The supply port 602 has a larger opening than the main outlet 606. The sidewalls 631 are symmetric with respect to a center imaginary line pointing from the supply port 602 to the main outlet 606 along the X direction. Each sidewall 631 has a side opening that couples the channel 610 to the external proximate region of the injection nozzle 110. The end of the side opening interfacing the external proximate region is referred to as the side outlet 642. In some embodiments, the side opening divides each sidewall 631 into two separated segments. In some embodiments, the side opening is a slot, such that each sidewall 631 is still one continuous segment. With respect to the position of the side outlet 642 in the X direction, the channel 610 is considered as comprising a front channel interfacing the supply port 602 (with a length L-a) and a rear channel interfacing the main outlet 606 (with a length L-b). In the illustrated embodiment in FIG. 10A, L-a is smaller than L-b with a ratio from about 1:1.1 to about 1:5, such as about 1:3. The injection nozzle 110 in FIG. 10B has the side outlet 642 positioned closer to the main outlet 606 than in FIG. 10A, such that L-a is equal to or larger than L-b with a ratio from about 1:1 to about 5:1, such as about 3:1. In some embodiments, the injection nozzle 110 may have multiple side outlets 642 opened at each sidewall 631, such as shown in FIGS. 10C and 10D. The injection nozzle 110 in FIG. 10C has two side outlets 642-*a* and 642-*b*. Each side outlet excites a respective Coanada flow propagating along the external surface of the sidewall 631 towards the main outlet 606. Correspondingly, the channel 610 is considered as comprising a front channel (with a length L-a), a middle channel (with a length L-b), and a rear channel (with a length L-c). In some embodiments, L-a, L-b, and L-c have an equal length. In some embodiments, the front channel is longer than the middle channel, and the middle channel is longer than the rear channel (L-a>L-b>L-c). In some other embodiments, it is vice versa (L-a<L-b<L-c). the injection nozzle 110 in FIG. 10D has three side outlets 642-*a*, 642-*b*, and 642-*c*. Correspondingly, the channel 610 is considered as comprising a front channel (with a length L-a), a first middle channel (with a length L-b), a second middle channel (with a length L-c), and a rear channel (with a length L-d). In some embodiments, the lengths of these channel portions have the relationship of L-a>L-b=L-c=L-d. In some embodiments, the lengths of these channel portions have the relationship of L-a>L-b>L-c>L-d. In some other embodiments, the lengths of these channel portions have the relationship of L-a<L-b<L-c<L-d.

FIGS. 11A-11C are perspective views of an apparatus 800 including the injection nozzle 110 and the suction nozzle 120 in various embodiments. In FIG. 11A, the apparatus 800 includes the injection nozzle 110 and the suction nozzle 120 as illustrated in FIGS. 6 and 7A. Alternatively, the suction nozzle 120 may be the one illustrated in FIG. 7B. Similarly, in FIG. 11B, the apparatus 800 includes the injection nozzle 110 and the suction nozzle 120 as illustrated in FIGS. 8 and 9A. Alternatively, the suction nozzle 120 may be the one illustrated in FIG. 9B. In either FIG. 11A or FIG. 11B, apparatus 800 is configured to generate the particle shield 130 between the injection nozzle 110 and the suction nozzle 120. In order to generate the particle shield 130, the injection nozzle 110 is driven by a gas pump with a driving force $F_{pump}$, and the suction nozzle 120 is driven by an exhaust pump with a suction force $F_{exhaust}$. Arrows in FIG. 8 symbolize gas flow direction from the gas pump to the exhaust pump. To maintain the particle shield 130 in a form of laminar flow, the suction force $F_{exhaust}$ is configured to be at least equal to or stronger than the driving force $F_{pump}$. In one embodiment, the suction force $F_{exhaust}$ is twice as strong as the driving force $F_{pump}$. The driving force $F_{pump}$ and the suction force $F_{exhaust}$ can be characterized as the gas stream speed feeding into the injection nozzle 110 and the gas stream speed leaving the suction nozzle 120, respectively. In one example, the gas stream speed feeding into the injection nozzle 110 is about 200 meters per second (m/s) and the gas stream speed leaving the suction nozzle 120 is about 200 m/s ($F_{exhaust}=F_{pump}$). In another example, the gas stream speed feeding into the injection nozzle 110 is about 200 meters per second (m/s) and the gas stream speed leaving the suction nozzle 120 is about 500 m/s ($F_{exhaust}>F_{pump}$). The gas stream traveling between the injection nozzle 110 and the suction nozzle 120 has a speed much faster than the speed of feeding into the injection nozzle 110, such as about 6 times to about 20 times of the speed feeding into the injection nozzle 110.

To help prevent particles or contaminants from falling onto or contacting a surface of an object 140, the particle shield 130 overlaps and is physically separated from the object 140. In some embodiments, the particle shied 130 has a width about 300 mm along a lengthwise direction of the injection nozzle 110 and a length from about 300 mm to about 450 mm along a direction pointing from the injection nozzle 110 to the suction nozzle 120. In various embodiments, object 140 can be a reticle (e.g., a EUV reticle), a photomask, a substrate, a wafer, an optical element (e.g., a reflector), or an optical illumination aperture.

The apparatus 800 synergistically excites both the Coanda flow and the Bernoulli flow around the injection nozzle 110 and the suction nozzle 120. As discussed above, the Coanda flow and the Bernoulli flow help compress the particle shield 130 from upper and lower sides, resulting in an ultra-thin laminar flow, such as a laminar flow with a thickness around 0.5 mm. An ultra-thin laminar flow has several benefits for particle shield applications. For example, in EUV lithography applications, unavoidably there is some energy loss associated with the transmission of EUV light through a particle shield, denoted as a transmission loss. With a thinner laminar flow, a greater transmission loss reduction for EUV light can be achieved. In one example, by using an $H_2$ laminar flow gas shield under a near vacuum environment (pressure about 0.021 Torr), the EUV transmission loss is less than about 0.0002% per gas shield.

Another benefit for an ultra-thin laminar flow is that a thinner laminar flow allows a larger gas flow velocity, which more effectively blows particle away from a protected surface. A chance that eddies or turbulences occur to disturb a laminar flow is benchmarked by the Reynolds number $R_e$. The Reynolds number $R_e$ can be calculated from shape, speed, viscosity, density, and some other factors of a fluid flow. When the Reynolds number $R_e$ is larger than 2100, eddies or turbulences are likely to occur and disrupt the laminar flow. In the illustrated embodiment, optimization of the system (nozzle geometry, surface roughness, flow velocity, etc.) with Computational Fluid Dynamics (CFD) ensures the Reynolds number $R_e$ to be less than 2000. The Reynolds number $R_e$ is proportional to a product of the laminar flow velocity and thickness. Therefore, to maintain a relatively small Reynolds number $R_e$, reducing a laminar flow thickness would allow a higher laminar flow velocity, which effectively means a stronger particle shielding capability. A higher laminar flow velocity also promotes a stronger pressure gradient due to the Bernoulli effect, which creates a stronger entrainment force for maintaining the laminarity of the particle shield. Due to the Bernoulli effect, a pressure gradient is reversed proportional to the velocity of fluid. Therefore, the higher the laminar flow velocity, the stronger the pressure gradient, which creates a stronger Bernoulli flow in turn to further compress the laminar flow.

Figure 11A:
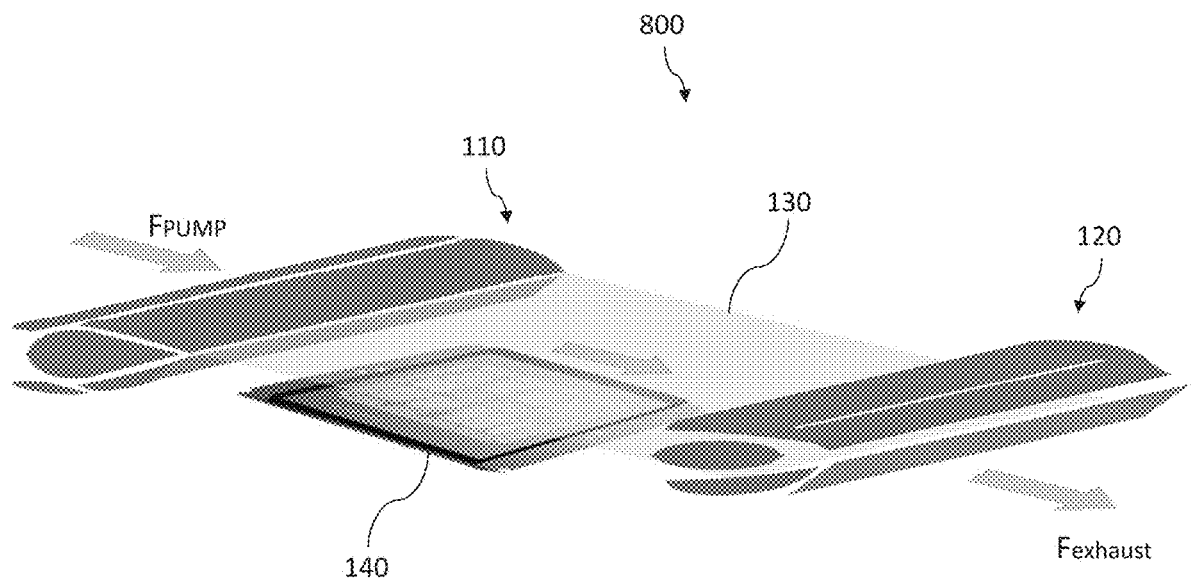
FIGS. 11A, 11B, and 11C are perspective views of an apparatus for generating a particle shield in accordance with one or more embodiments.
Figure 11B:
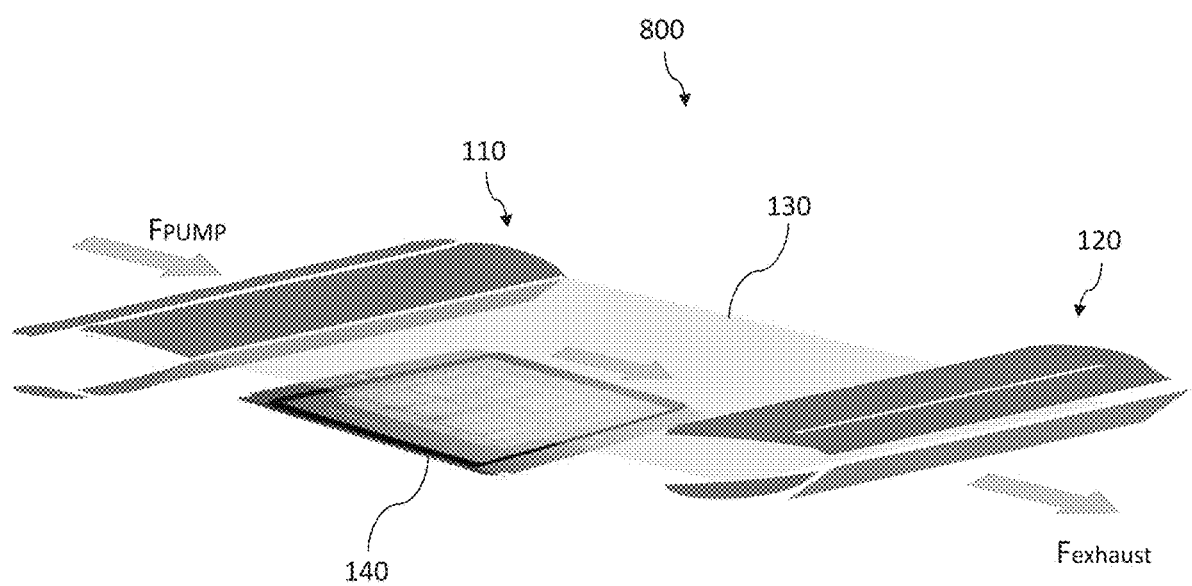
Figure 11C:
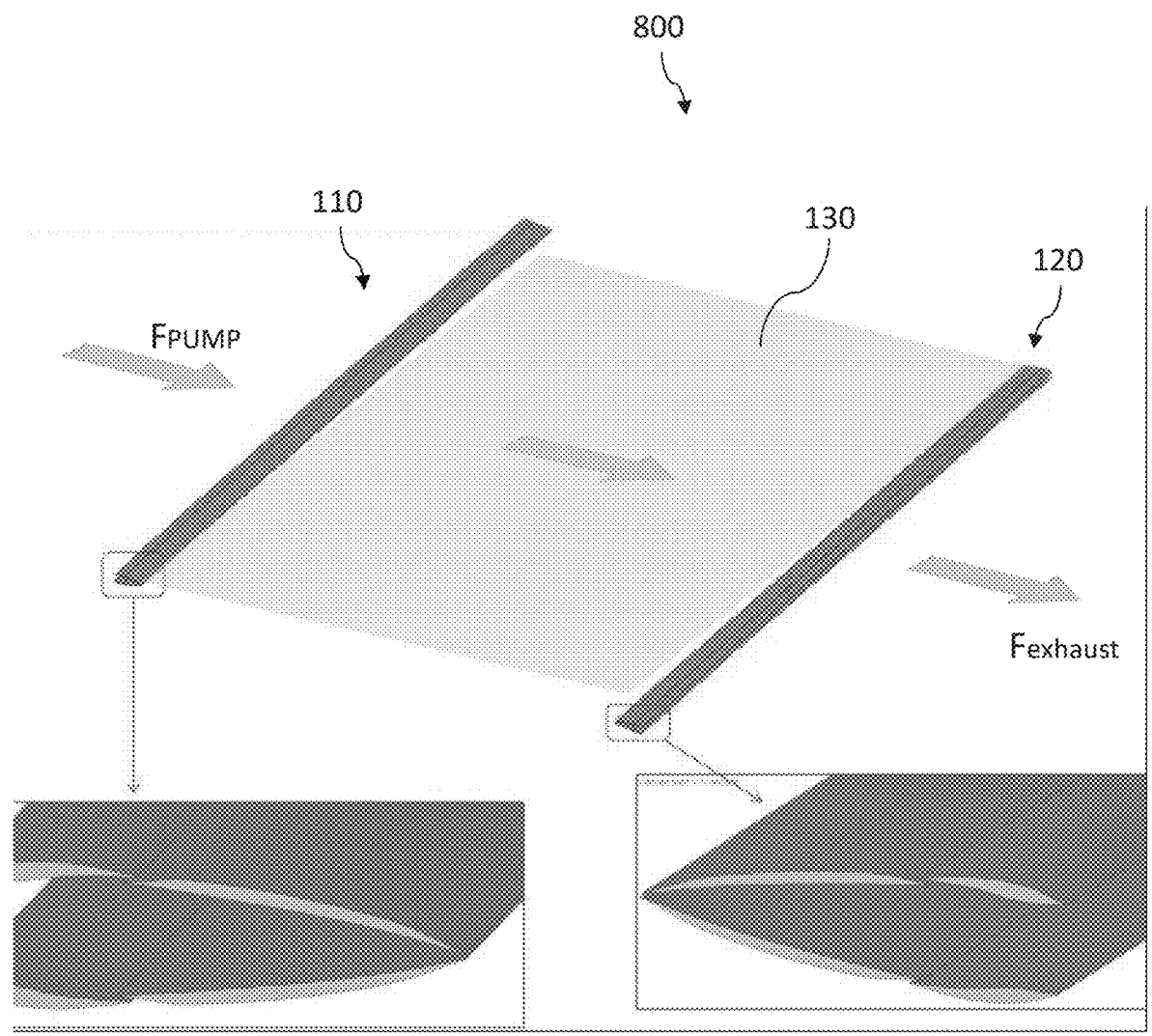

In some embodiments, the injection nozzles illustrated in FIGS. 6, 8, and 10A-10D may also be used as suction nozzles by coupling the supply port 602 to an exhaust pump, such that the gas stream traveling direction in the injection nozzle is reversed. FIG. 11C gives such an embodiment. Referring to FIG. 11C, the injection nozzle 110 and the suction nozzle 120 are identical to the ones illustrated in FIG. 8. The injection nozzle 110 has its supply port 602 coupled to a supply pump, while the suction nozzle 120 has its supply port 602 coupled to an exhaust pump. In one embodiment, with the injection nozzle 110 with a supply pump only that has a driving force $F_{pump}$ about 200 m/s, the gas stream jetted away from the injection nozzle 110 has a speed at least about 1200 m/s (6 times of $F_{pump}$). In another embodiment, with the injection nozzle 110 with a supply pump of driving force $F_{pump}$ about 200 m/s and the suction nozzle 120 with an exhaust pump of suction force $F_{exhaust}$ about 200 m/s, the gas stream jetted away from the injection nozzle 110 has a speed about 1800 m/s (9 times of $F_{pump}$). In yet another embodiment, with the injection nozzle 110 with a supply pump of driving force $F_{pump}$ about 200 m/s and the suction nozzle 120 with an exhaust pump of suction force $F_{exhaust}$ larger than $F_{pump}$, the gas stream jetted away from the injection nozzle 110 may achieve a speed about 4000 m/s (20 times of $F_{pump}$). Since kinetic energy is proportional to the square of flow velocity, 20 times speeding up with a stronger exhaust pump is equivalent to increase particle shielding kinetic energy by about 400 times, which is a significant enhancement for particle shielding. As a benchmark, in either cases discussed above, the gas stream jetted away from the injection nozzle 110 is faster than a speed of sound in air, which is about 340 m/s. As a comparison, a conventional rectangular-shaped injection nozzle, without side outlets to excite the Coanda flow and the Bernoulli flow, and with a supply pump of driving force $F_{pump}$ about 200 m/s may only provide a gas stream at a speed about 600 m/s (3 times), which is much slower than the nozzles provided in this disclosure. The thickness of the particle shield provided by a conventional rectangular-shaped injection nozzle may also be about 2 to 3 times thicker than the particle shield 130 generated by the nozzles provided in this disclosure.

Figure 12:
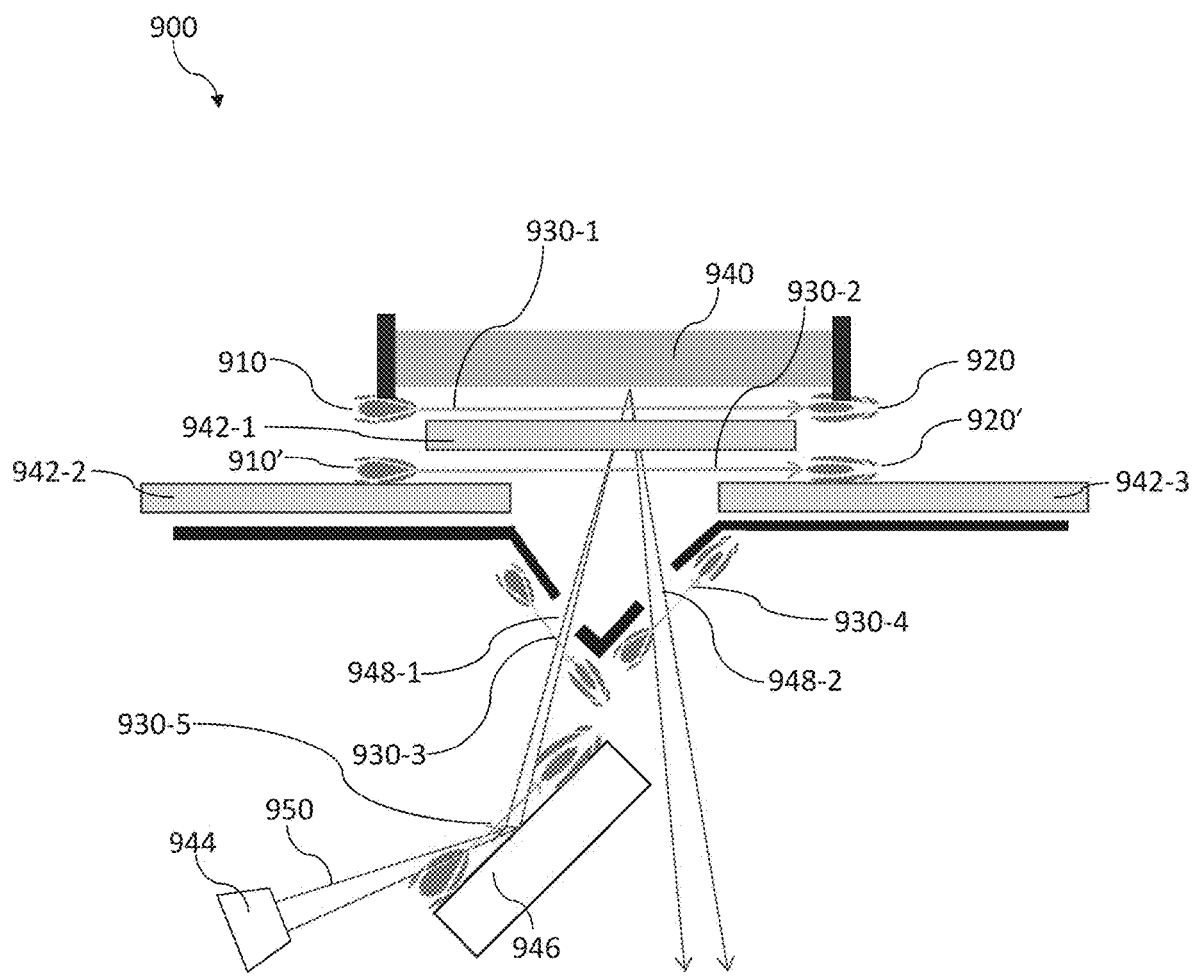
FIG. 12 is a schematic view of a EUV lithography system in accordance with one or more embodiments.

FIG. 12 is a schematic view of a EUV lithography system 900 in accordance with one or more embodiments. EUV lithography system 900 includes an apparatus for generating particle shields 930 (e.g., particle shields 930-1, 930-2, 930-3, 930-4, and 930-5) similar to the particle shield 130. EUV lithography system 900 includes a EUV reticle 940, a plurality of reticle masking (REMA) blades 942 (e.g., REMA blades 942-1, 942-2, and 942-3), a radiation source 944, a plurality of reflectors or mirrors 946, and a set of optical illumination apertures 948 (e.g., apertures 948-1 and 948-2). The radiation source 944 may provide EUV light having a wavelength of approximately 13.5 nm. A beam of EUV light 950 is generated by the EUV radiation source 944, propagates along an optical path to the reflectors 946 and the aperture 948 to the reticle 940. EUV light 950 is reflected by the reticle 940, which later forms an image onto a wafer. The REMA blades 942 block EUV light that might otherwise leak through pin holes in the border area and selectively block reticle alignment targets so that they are not printed on the wafer. Each REMA blade 942 can independently move in a horizontal direction by linear stage mechanisms that are driven by linear motors. In some embodiments, a distance between the reticle 940 and REMA blade 942-1 ranges from about 10 mm to about 100 mm. In the illustrated embodiment, REMA blades 942-2 and 942-3 stack below the REMA blade 942-1.

Photolithography system 900 further includes a plurality of injection nozzles and suction nozzles similar to the respective components discussed above in association with the apparatus 800, such as a first injection nozzle 910, a first suction nozzle 920, a second injection nozzle 910' and a second suction nozzle 920'. A first particle shield 930-1 is between the reticle 940 and the REMA blade 942-1. A second particle shield 930-2 is between the stack of the REMA blades, such as between the REMA blade 942-1 and the REMA blades 942-2/942-3. Therefore, the REMA blade 942-1 is sandwiched between the first particle shield 930-1 and the second particle shield 930-2. Both first particle shield 930-1 and second particle shield 930-2 help prevent particles or contaminants from adhering or falling onto reticle 940 and the REMA blade 942. A third particle shield 930-3 and a fourth particle shield 930-4 cover the optical illumination apertures 948-1 and 948-2, respectively, which help prevent particles or contaminants from entering the reticle chamber above. Depending on the position of the optical illumination apertures 948-1 and 948-2, the third and fourth particle shields 930-3/930-4 may or may not be parallel to the first and second particle shields 930-1/930-2. In the illustrated embodiment, the third and fourth particle shields 930-3/930-4 form an angle about 40 degrees to about 80 degrees with respect to the first and second particle shields 930-1/930-2. In some embodiments, particle shields 930 include a non-solid materialistic particle air shield. For example, particle shields 930 may include hydrogen, ambient air, helium, nitrogen or inert gases, such as a $H_2$ laminar jet flow. In some embodiments, particle shields 930 may include different gases. In some embodiments, a thickness of each particle shield 930 ranges from about 0.5 mm to about 2 mm. In some embodiments, each particle shield 930 has a transmission loss less than about 0.0002% for EUV light. In various embodiments, depending on a requirement of cleanliness, one or more sets of components for generating particles shields are positioned proximate a surface of any of radiation source 944, reflectors 946 (e.g., the particle shield 930-5), or the wafer. In some embodiments, one or more of the particle shields 930 may further include a combination of the energy gradient force and the velocity dependent force. For example, first particle shield 930-1 includes a laminar gaseous flow and second particle shield 930-2 includes an electromagnetic Lorentz force or a thermal gradient force.

One aspect of this description relates to an apparatus for generating a plurality of particle shields. The at least one particle shield includes a first component and a second component. The first component and the second component are usable to form a first particle shield of the at least one particle shield for blocking particles from contacting a proximate surface of an object, the first particle shield is substantially parallel to and physically separated from the proximate surface of the object, and the first particle shield includes an energy gradient force or a velocity gradient force.

Another aspect of this description relates to a photolithography system. The photolithography system includes a photomask, a slit, at least one optical element, a first apparatus generating a first particle shield, and a second apparatus generating a second particle shield, wherein the slit is between the first particle shield and the second shield.

Still another aspect of this description relates to a method for photolithography in semiconductor manufacturing. The method includes positioning a shield generator between a photomask and a slit, forming a particle shield by the shield generator to help prevent particles from adhering to a surface of the photomask or a surface of the slit, and remove the particles along an optical path, wherein the shield generator is between the photomask and the slit, and performing an exposure to transfer one or more patterns in the photomask onto a substrate or a layer on the substrate.

Still another aspect of this description relates to an apparatus for generating a laminar flow. The apparatus includes an injection nozzle and a suction nozzle, wherein the injection nozzle and the suction nozzle are operable to form the laminar flow for blocking particles from contacting a proximate surface of an object, wherein the injection nozzle includes a main outlet to blow out the laminar flow, wherein the injection nozzle is configured to generate a Coanda flow along an external surface of the injection nozzle, and wherein the suction nozzle is configured to provide a gas pressure gradient for the laminar flow. In some embodiments, the Coanda flow compresses the laminar flow in a proximate region of the main outlet. In some embodiments, the Coanda flow excites a Bernoulli flow to further compress the laminar flow in a proximate region of the main outlet. In some embodiments, the injection nozzle includes a side outlet to blow out the Coanda flow. In some embodiments, a ratio of flow rate of the side outlet and the main outlet is about 1:1. In some embodiments, the suction nozzle has a main inlet to receive the laminar flow and a side inlet to generate another Coanda flow along an external surface of the suction nozzle. In some embodiments, the another Coanda flow compresses the laminar flow in a proximate region of the main inlet. In some embodiments, the main inlet has a wider opening than the main outlet. In some embodiments, the injection nozzle is coupled to a first pump and the suction nozzle is coupled to a second pump, and wherein the second pump provides a stronger force than the first pump. In some embodiments, the laminar flow has a Reynolds number less than 2000. In some embodiments, a ratio of a speed of the laminar flow after and before flowing through the injection nozzle is from about 9:1 to about 20:1. In some embodiments, a speed of the laminar flow traveling between the injection nozzle and the suction nozzle is faster than a speed of sound in air.

Still another aspect of this description relates to an apparatus for generating a laminar flow. The apparatus includes a pump; and an injection nozzle, the injection nozzle including a sidewall defining a gas communication channel with an input port and an output port, the input port coupled to the pump, wherein the sidewall has a side opening that couples the gas communication channel to a proximate region external to the injection nozzle. In some embodiments, the apparatus further includes a flow splitter surrounded by the gas communication channel, such that the flow splitter divides the gas communication channel into sub-channels. In some embodiments, the side opening is configured to divide a gaseous flow from the pump into a first portion flowing towards the output port and a second portion flowing through the side opening into the proximate region. In some embodiments, the side opening and the sidewall are configured such that the second portion of the gaseous flow forms a Coanda flow traveling along an external surface of the sidewall towards the output port.

Yet another aspect of this description relates to an apparatus for generating a particle shield in a photolithography system. The apparatus includes a pump; and an injection nozzle coupled to the pump, the injection nozzle including a main outlet, a side outlet, and a side splitter, wherein the side splitter is configured to split a gaseous flow from the pump into a first potion flowing towards the main outlet and a second portion flowing towards the side outlet. In some embodiments, the first portion of the gaseous flow forms a laminar flow after leaving the main outlet, thereby forming the particle shield. In some embodiments, the second portion of the gaseous flow forms a Coanda flow along an external surface of the injection nozzle after leaving the side outlet. In some embodiments, the particle shield has a thickness less than 1 mm defined by full width at half maximum (FWHM) of a flow velocity distribution of the particle shield. In some embodiments, a ratio of a speed of the gaseous flow after and before flowing through the injection nozzle is at least 6:1.

Yet another aspect of this description relates to an apparatus for generating at least one particle shield during a photolithography process. The apparatus includes a first component; and a second component, wherein the first component and the second component are operable to form a first particle shield of the at least one particle shield for blocking particles from contacting a proximate surface of an object, wherein the first component and the second component are on a same side of the object, and wherein the first particle shield includes a thermal gradient driving force generated by a temperature difference between the first component and the second component. In some embodiments, the apparatus further includes a third component and a fourth component, wherein the third component and the fourth component are operable to form a second particle shield of the at least one particle shield for blocking particles from contacting the proximate surface of the object, and wherein the second particle shield is a gaseous shield.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for generating a laminar flow over a substrate, comprising:
    a pump; and
    an injection nozzle, the injection nozzle including a sidewall defining a gas communication channel with an input port and an output port, the input port coupled to the pump,
    wherein the sidewall has a side opening that couples the gas communication channel to a proximate region external to the injection nozzle, wherein the side opening faces in a direction away from the substrate and is configured to divide a gaseous flow from the pump into a first portion flowing towards the output port and a second portion flowing through the side opening into the proximate region, and wherein the side opening and the sidewall are configured such that the second portion of the gaseous flow forms a Coanda flow traveling along an external surface of the sidewall towards the output port.

2. The apparatus of claim 1, further comprising:
    a flow splitter surrounded by the gas communication channel, such that the flow splitter divides the gas communication channel into sub-channels.

3. The apparatus of claim 1, wherein the laminar flow has a thickness less than 1 mm defined by full width at half maximum (FWHM) of a flow velocity distribution of the laminar flow.

4. The apparatus of claim 1, wherein the proximate region is a low pressure region.

5. An apparatus for generating a particle shield in a photolithography system, comprising:
    a pump; and
    an injection nozzle coupled to the pump, the injection nozzle including a main outlet, a side outlet, and a side splitter, wherein the side splitter is configured to split a gaseous flow from the pump into a first portion flowing towards the main outlet and a second portion flowing towards the side outlet, wherein the second portion flows towards the main outlet in a proximate region external to the injection nozzle after leaving the side outlet.

6. The apparatus of claim 5, wherein the first portion of the gaseous flow forms a laminar flow after leaving the main outlet, thereby forming the particle shield.

7. The apparatus of claim 5, wherein the second portion of the gaseous flow forms a Coanda flow along an external surface of the injection nozzle after leaving the side outlet.

8. The apparatus of claim 5, wherein the particle shield has a thickness less than 1 mm defined by full width at half maximum (FWHM) of a flow velocity distribution of the particle shield.

9. The apparatus of claim 5, wherein a ratio of a speed of the gaseous flow after and before flowing through the injection nozzle is at least 6:1.

10. A nozzle for generating a gaseous flow, comprising:
    an input port configured to receive gas;
    an output port configured to jet the gaseous flow;
    a flow splitter configured to divide the gas received by the input port into a first channel and a second channel, wherein the first and second channels coupled to the output port;
    a first side flow splitter configured to guide a portion of the gas in the first channel to a proximate region outside the nozzle; and
    a second side flow splitter configured to guide a portion of the gas in the second channel to the proximate region outside the nozzle.

11. The nozzle of claim 10, wherein the flow splitter has a first end facing the input port and a second end facing the output port, wherein the first end is wider than the second end.

12. The nozzle of claim 11, wherein the first end has a rounded tip and the second end has a pointed tip.

13. The nozzle of claim 10, wherein each of the first and second side flow splitter has an external surface and an internal surface, wherein the external surface has a longer contour length than the internal surface.

14. The nozzle of claim 13, wherein the external surface is a convex surface.

15. The nozzle of claim 13, wherein the internal surface is a flat surface.

16. The nozzle of claim 10, wherein the flow splitter equally divides the gas.

17. The nozzle of claim 10, wherein each of the first and second side flow splitters unequally divides the gas.

18. The nozzle of claim 10, wherein the proximate region is a low pressure region.

19. The nozzle of claim 10, wherein the gaseous flow is a laminar flow.

20. The nozzle of claim 19, wherein a speed of the laminar flow is faster than a speed of sound in air.

* * * * *